United States Patent
Sakai

(10) Patent No.: US 8,243,500 B2
(45) Date of Patent: Aug. 14, 2012

(54) SEMICONDUCTOR MEMORY AND SYSTEM

(75) Inventor: Yasumitsu Sakai, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 315 days.

(21) Appl. No.: 12/755,002

(22) Filed: Apr. 6, 2010

(65) Prior Publication Data

US 2010/0259972 A1    Oct. 14, 2010

(30) Foreign Application Priority Data

Apr. 8, 2009 (JP) .................................. 2009-093990

(51) Int. Cl.
*G11C 11/00* (2006.01)

(52) U.S. Cl. ........................................................ 365/154

(58) Field of Classification Search .................... 365/154
See application file for complete search history.

(56) References Cited

U.S. PATENT DOCUMENTS

| 7,113,445 B1 | 9/2006 | Sancheti et al. |
| 2008/0099812 A1* | 5/2008 | Nagata et al. ................. 257/298 |
| 2008/0135942 A1* | 6/2008 | Minagawa ..................... 257/368 |

* cited by examiner

*Primary Examiner* — Hoai V Ho
*Assistant Examiner* — Pablo Huerta
(74) *Attorney, Agent, or Firm* — Arent Fox LLP

(57) ABSTRACT

A semiconductor memory has a short transistor coupling complementary storage nodes of a latch circuit of a memory cell. A transfer transistor and the short transistor have a diffusion layer in common coupled to one of the storage nodes. The short transistor and a driver transistor have a diffusion layer in common coupled to the other storage node. The transfer transistor, the short transistor, and the driver transistor are continuously disposed via the diffusion layers in common, and thereby, variation of characteristics of the transfer transistor can be prevented. Accordingly, it may be possible to prevent that current supplying ability of the transfer transistor changes depending on a layout in the memory cell, and that an operation margin of the memory cell deteriorates.

12 Claims, 25 Drawing Sheets

SEMICONDUCTOR MEMORY AND SYSTEM

CROSS-REFERENCE TO RELATED APPLICATION

This application is based upon and claims the benefit of priority from Japanese Patent Application No. 2009-093990, filed on Apr. 8, 2009, the entire contents of which are incorporated herein by reference.

FIELD

The present embodiment relates to a semiconductor memory having a static memory cell, and a system.

BACKGROUND

A multiport memory is known as a semiconductor memory capable of simultaneously executing a read operation and a write operation for one memory cell. Besides, a method shorting complementary storage nodes in a memory cell at the write operation time is proposed to improve write characteristics of the multiport memory (see, for example, U.S. Pat. No. 7,113,445 B1).

In a memory cell array, elements and wirings are laid out in high density compared to peripheral circuits. Accordingly, electric characteristics of transistors in the memory cell may vary easily. It may be therefore necessary to prevent deterioration of the electric characteristics of the memory cell or deterioration of an operation margin when the transistor shorting the complementary storage nodes is disposed in the memory cell. Besides, in a write operation, data stored in a memory cell to which data is not written may be lost caused by the shorts of the complementary storage nodes when the data is written to only a part of memory cells among the memory cells coupled to a word line.

SUMMARY

According to an aspect of the embodiments, a semiconductor memory includes a memory cell having a first and a second inverters each including a load transistor and a driver transistor; a latch circuit formed by coupling inputs and outputs of the first and the second inverters with each other, and having a first storage node coupled to the output of the first inverter and a second storage node coupled to the output of the second inverter; a first and a second transfer transistors coupling the first and the second storage nodes to a first bit line pair, respectively; a third and a fourth transfer transistors coupling the first and the second storage nodes to a second bit line pair, respectively; and a first and a second short transistors coupling the first and the second storage nodes with each other, in which the first transfer transistor, the first short transistor, and the driver transistor of the second inverter are disposed along one direction; the fourth transfer transistor, the second short transistor, and the driver transistor of the first inverter are disposed along one direction; the first transfer transistor and the first short transistor have a diffusion layer in common coupled to the first storage node; the first short transistor and the driver transistor of the second inverter have a diffusion layer in common coupled to the second storage node; the fourth transfer transistor and the second short transistor have a diffusion layer in common coupled to the second storage node; and the second short transistor and the driver transistor of the first inverter have a diffusion layer in common coupled to the first storage node.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
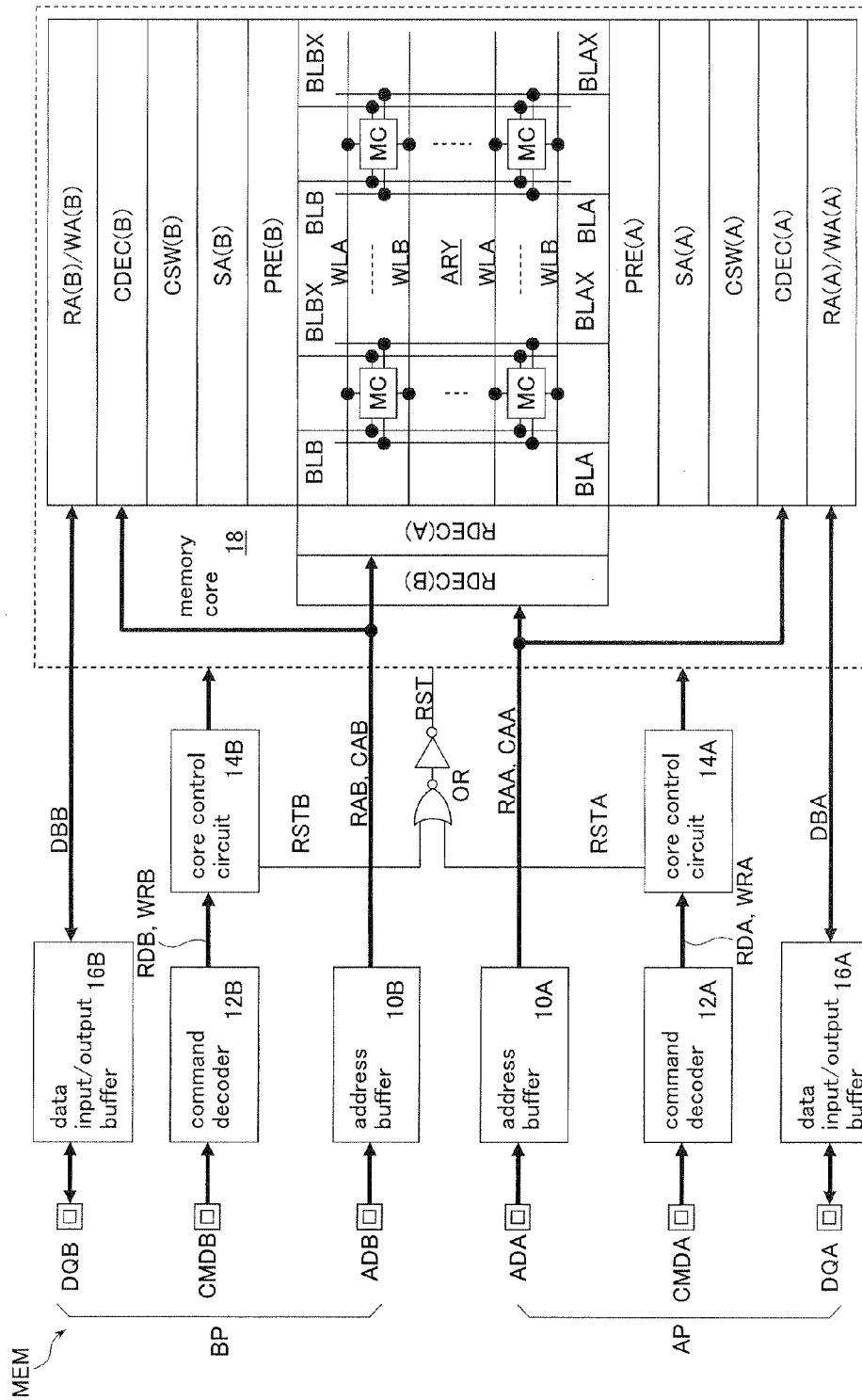
FIG. 1 illustrates an example of a semiconductor memory in an embodiment.

Hereinafter, embodiments are described by using the drawings. In the drawings, a signal line illustrated by a heavy line represents plural lines. Besides, a part of a block to which the heavy line is coupled has plural circuits. The same reference symbol as a signal name is used for a signal line in which a signal is transmitted. A signal having a character "Z" at the end thereof represents a positive logic. A signal having a character "X" at the end thereof represents a negative logic. A double square mark in the drawing represents an external terminal. The external terminal is, for example, a pad on a semiconductor memory chip, or a lead of a package to which the semiconductor memory chip is housed. The same reference symbol as a terminal name is used for a signal supplied via the external terminal.

FIG. 1 illustrates an example of a semiconductor memory MEM in one embodiment. For example, the semiconductor memory MEM is a static RAM in multiport type. The semiconductor memory MEM illustrated in FIG. 1 may operate in synchronous with a clock signal, or may operate in asynchronous with the clock signal. The semiconductor memory MEM may be designed as a memory macro (IP) mounted on a system LSI and so on, or as a semiconductor memory device sealed in a package.

The semiconductor memory MEM is, for example, formed on a silicon substrate by using a CMOS process. The semiconductor memory MEM has address buffers 10A, 10B, command decoders 12A, 12B, core control circuits 14A, 14B, data input/output buffers 16A, 16B, and a memory core 18. The characters "A" and "B" added at the end of the reference numerals correspond to a port AP and a port BP. A system accessing the semiconductor memory MEM is able to execute each of a read operation and a write operation of the semiconductor memory MEM independently via the two ports AP, BP.

The address buffer 10A outputs an address signal received at an address terminal ADA as a row address signal RAA and a column address signal CAA. One of word lines WLA is selected by the row address signal RAA. One of bit line pairs BLA, BLAX is selected by each data terminal DQA by the column address signal CAA and a memory cell MC is accessed. The address buffer 10B outputs an address signal received at an address terminal ADB as a row address signal RAB and a column address signal CAB. One of word lines WLB is selected by the row address signal RAB. One of bit line pairs BLB, BLBX is selected by each data terminal DQB by the column address signal CAB, and a memory cell MC is accessed.

The command decoder 12A decodes a command signal CMDA to operate the memory core 18, and outputs as a read signal RDA or a write signal WRA. The command decoder 12B decodes a command signal CMDB to operate the memory core 18, and outputs as a read signal RDB or a write signal WRB. For example, each command signal CMDA (or CMDB) is a chip select signal, an output enable signal, or a write enable signal.

The core control circuit 14A outputs a control signal (timing signal) to operate the memory core 18 in accordance with the read signal RDA or the write signal WRA from the command decoder 12A. The control signal includes a reset signal RSTA. The core control circuit 14B outputs a control signal (timing signal) to operate the memory core 18 in accordance with the read signal RDB or the write signal WRB from the command decoder 12B. The control signal includes a reset signal RSTB. The reset signals RSTA, RSTB are supplied to the memory core 18 as a reset signal RST via an OR circuit. Incidentally, the OR circuit may be formed at one of the core control circuits 14A, 14B, or in the memory core 18.

The data input/output buffer 16A outputs a read data output from a memory cell array ARY via a read amplifier RA (A) and a data bus DBA to the data terminal DQA. The data input/output buffer 16A outputs a write data supplied to the data terminal DQA to the memory cell array ARY via the data bus DBA and a write amplifier WA (A). The data input/output buffer 16B outputs a read data output from the memory cell array ARY via a read amplifier RA (B) and a data bus DBB to the data terminal DQB. The data input/output buffer 16B outputs a write data supplied to the data terminal DQB to the memory cell array ARY via the data bus DBB and a write amplifier WA (B).

Figure 6:
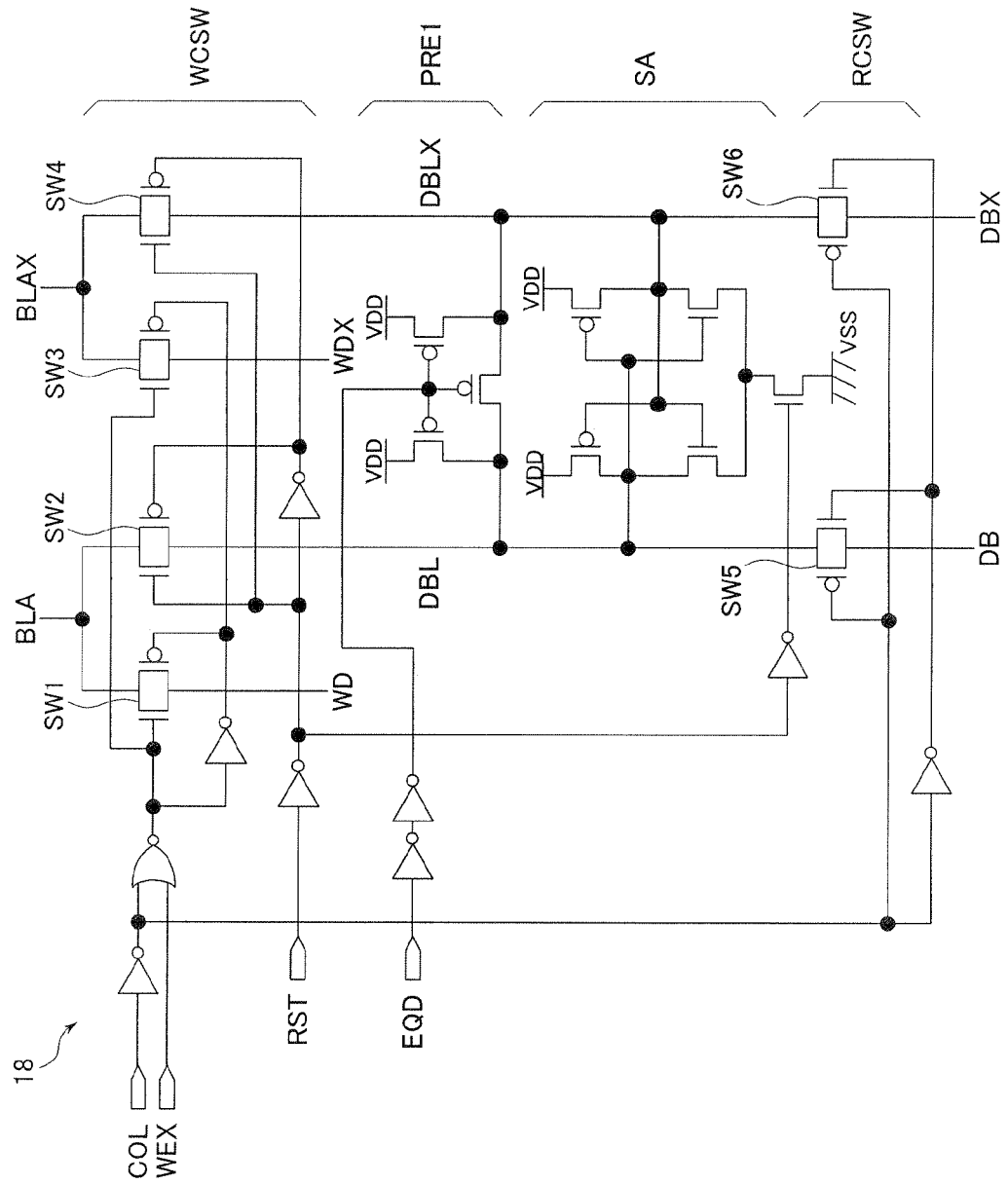
FIG. 6 illustrates an example of a substantial part of a memory core illustrated in FIG. 1.
Figure 7:
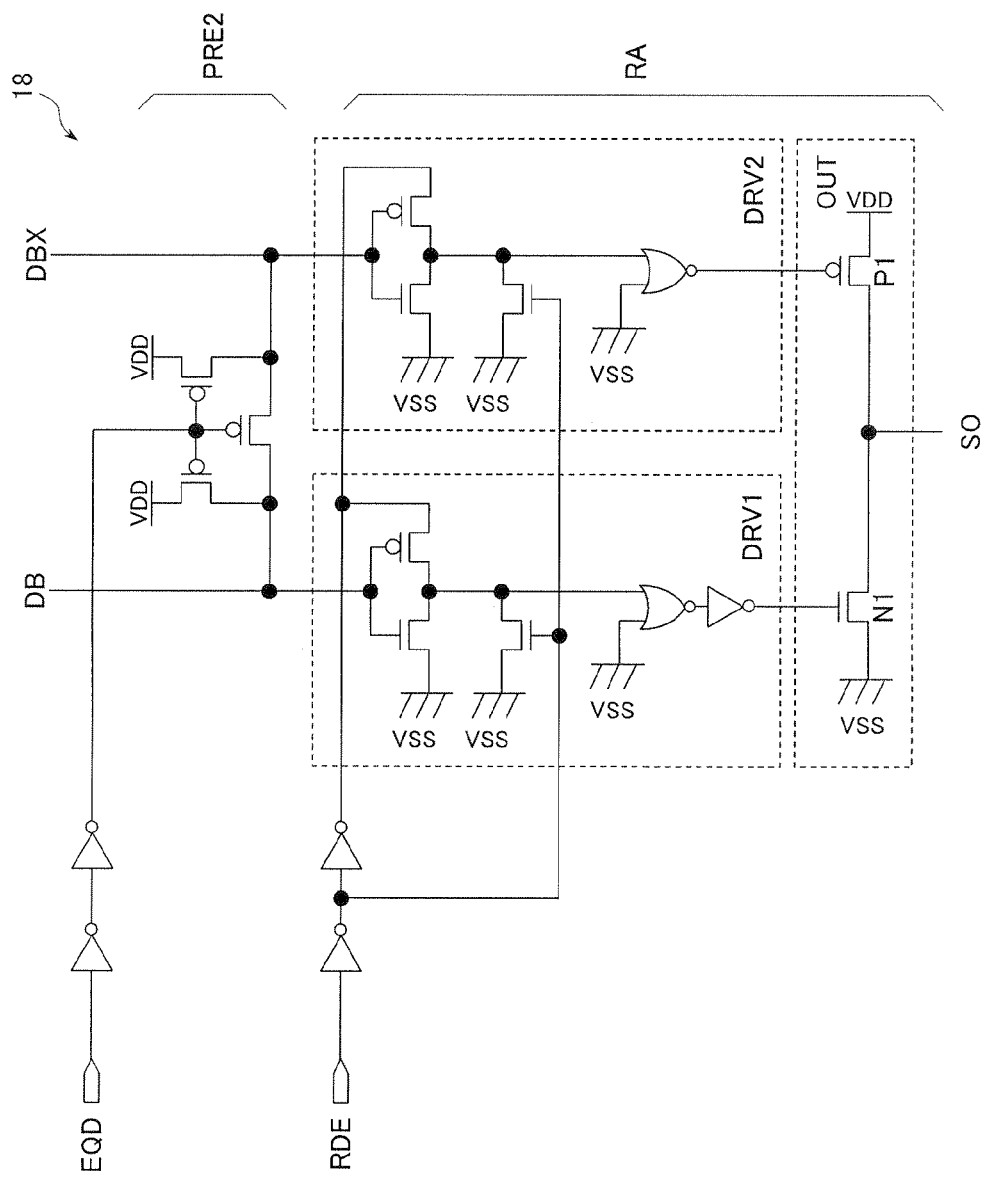
FIG. 7 illustrates an example of a substantial part of the memory core illustrated in FIG. 1.
Figure 8:
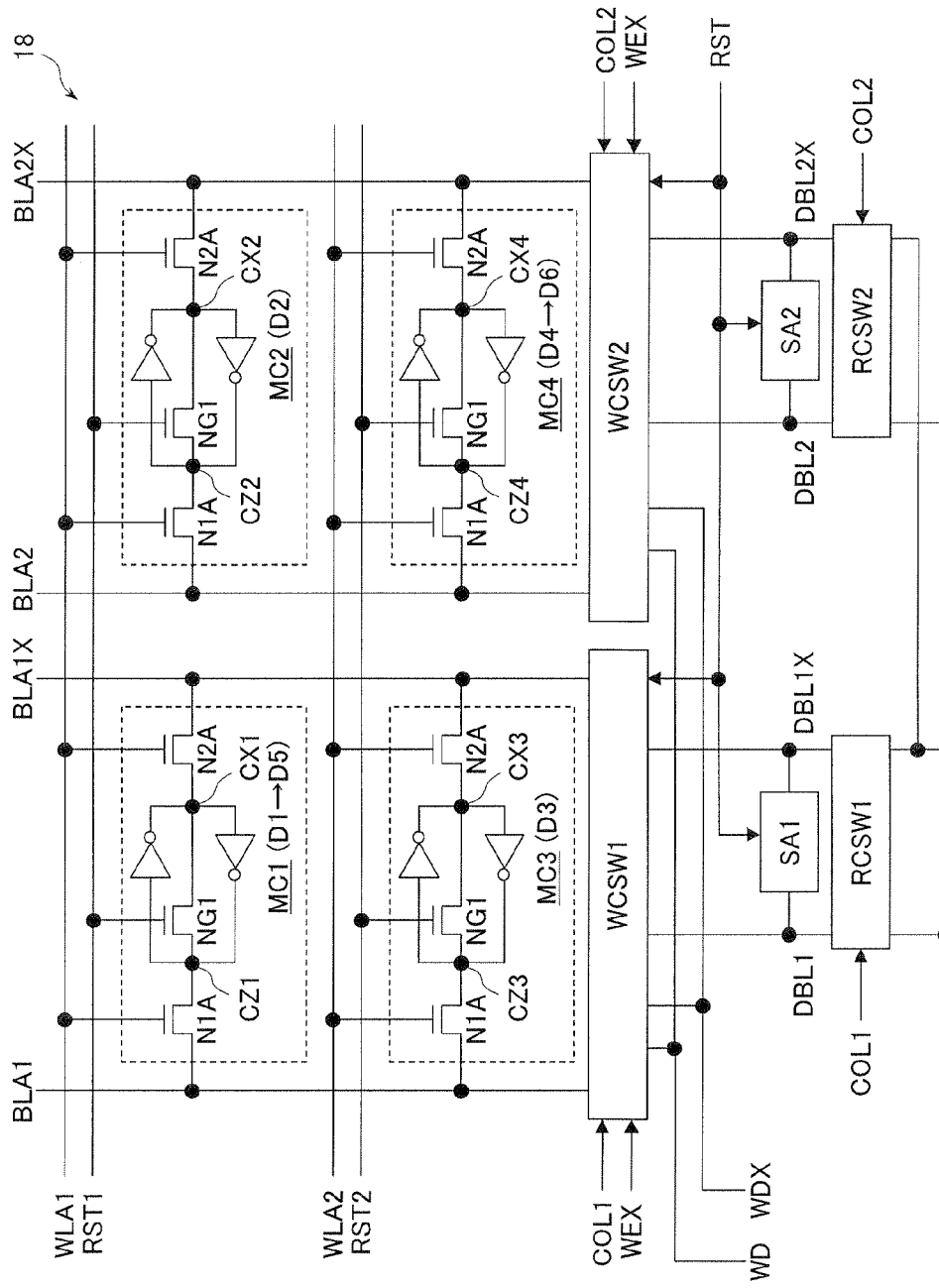
FIG. 8 illustrates an outline of the memory core illustrated in FIG. 1.

The memory core 18 has row decoders RDEC (A)/(B), precharge circuits PRE (A)/(B), sense amplifiers SA (A)/(B), column switches CSW (A)/(B), column decoders CDEC (A)/(B), the read amplifiers RA (A)/(B), the write amplifiers WA (A),(B), and the memory cell array ARY. The characters "A" and "B" in parentheses of the reference symbols correspond to the ports AP, BP. Circuits correspond to the ports AP, BP are the same with each other, and therefore, elements corresponding to the port AP are described in the following. Details of the memory core 18 are illustrated in FIG. 6 to FIG. 8.

The row decoder RDEC decodes the row address signal RAA to select one of the word lines WLA. The precharge circuit PRE sets all of bit lines BLA, BLAX at high level during a standby period when the command signal CMDA is not supplied. The sense amplifier SA amplifies a voltage difference between the bit lines BLA, BLAX when the read operation and the write operation are executed.

The column decoder CDEC decodes the column address signal CAA, and generates a column selection signal. The column switch CSW couples the bit line pair BLA, BLAX selected by the column selection signal to the read amplifier RA or the write amplifier WA. The read amplifier RA amplifies complementary read data output via the column switch CSW, and outputs as a read data signal at the read operation time. The write amplifier WA outputs a write data supplied via the data bus DBA to the bit line pair BLA, BLAX as complementary write data signals at the write operation time.

Figure 3:
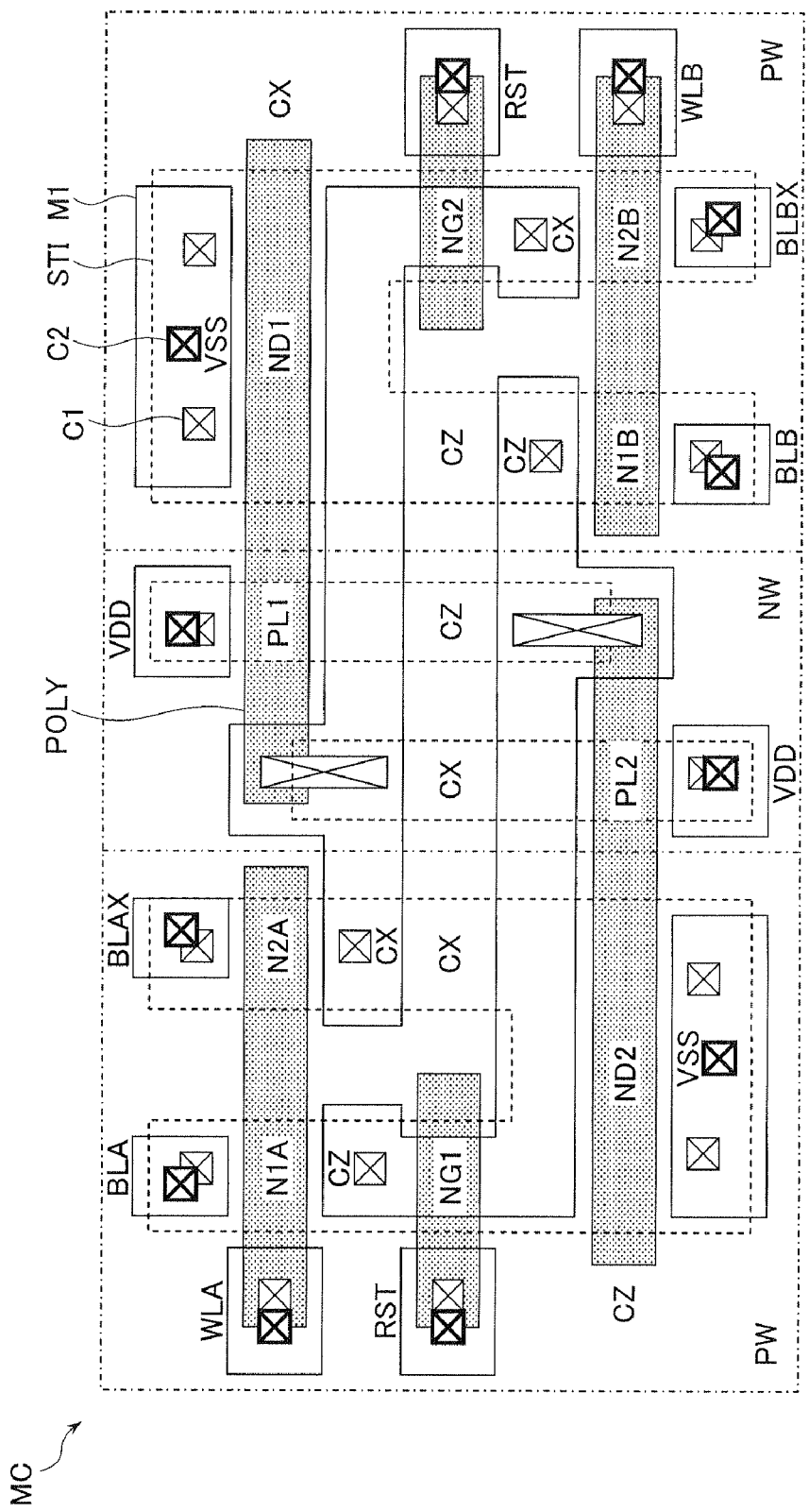
FIG. 3 illustrates an example of a layout of the memory cell illustrated in FIG. 2.
Figure 4:
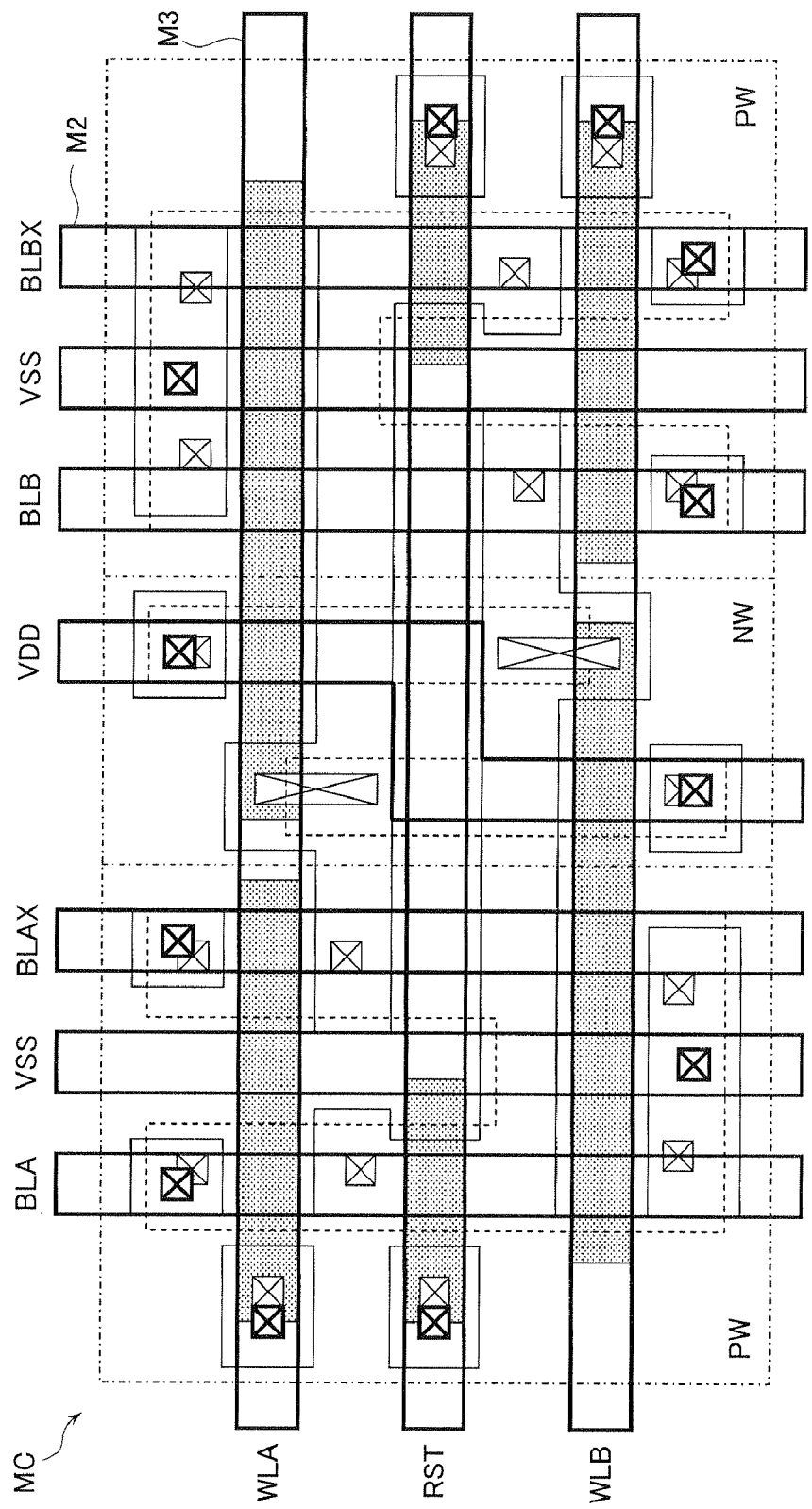
FIG. 4 illustrates an example of a wiring layout of the memory cell illustrated in FIG. 3.

The memory cell array ARY has plural static memory cells MC disposed in a matrix state. The memory cells MC arranged in a horizontal direction of the drawing are coupled to common word lines WLA, WLB. The memory cells MC arranged in a vertical direction of the drawing are coupled to the common bit line pair BLA, BLAX and bit line pair BLB, BLBX. Namely, the memory cell MC can be read/written by using at least either of the two ports. Details of the memory cell MC are illustrated in FIG. 2 to FIG. 4.

Figure 2:
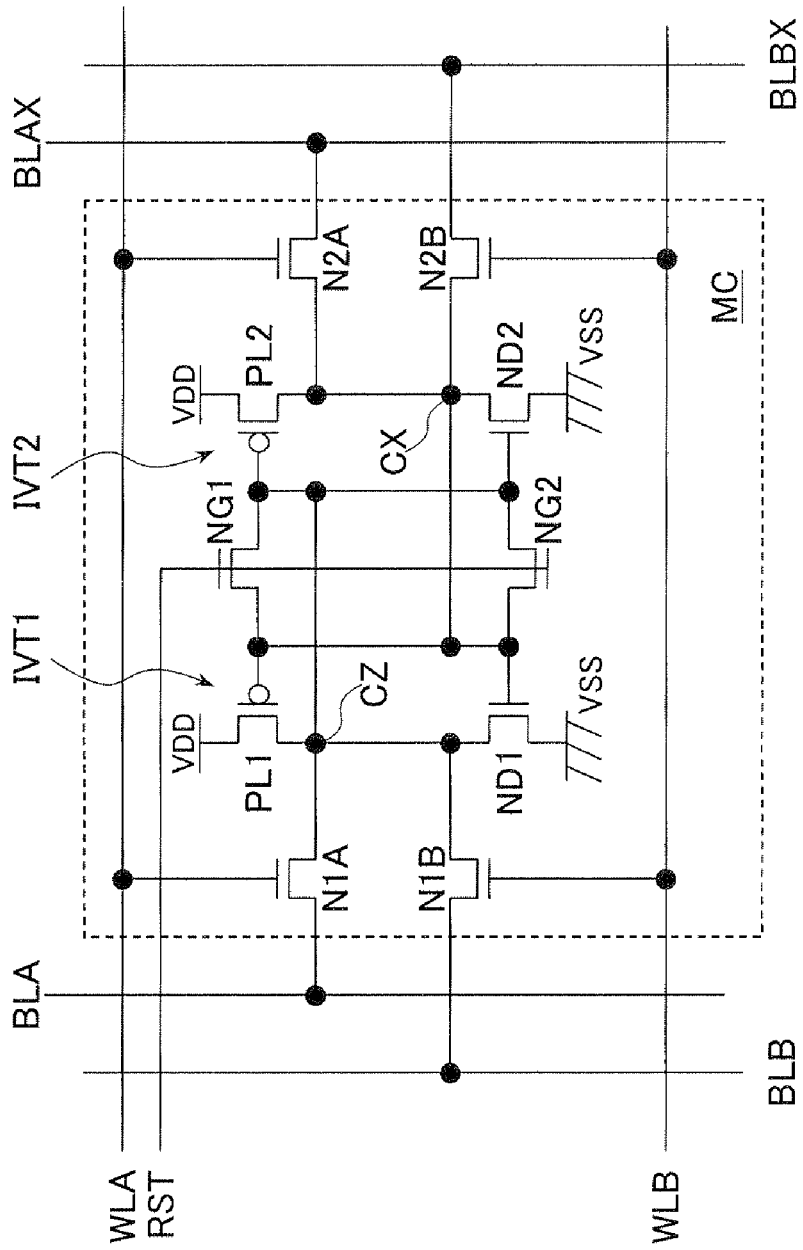
FIG. 2 illustrates an example of a memory cell illustrated in FIG. 1.

FIG. 2 illustrates an example of the memory cell MC illustrated in FIG. 1. The memory cell MC has a pair of CMOS inverters IVT1, IVT2 of which inputs and outputs are coupled with each other, transfer transistors N1A, N2A, N1B, N2B, and short transistors NG1, NG2. The inverter IVT1 has a load transistor PL1 and a driver transistor ND1. The inverter IVT2 has a load transistor PL2 and a driver transistor ND2. The output of the inverter IVT1 is coupled to the input of the inverter IVT2 via a node CZ. The output of the inverter IVT2 is coupled to the input of the inverter IVT1 via a node CX.

The node CZ is a positive logic storage node of the memory cell MC. The node CX is a negative logic storage node of the memory cell MC. Namely, when a logic "1" is stored in the memory cell MC, the node CZ stores the logic "1", and the node CX stores a logic "0" (zero). A transistor having a character "P" at the top of the reference symbol represents a pMOS transistor. The transistor having the character "N" at the top of the reference symbol represents an nMOS transistor. The nodes CZ, CX are coupled with each other via the short transistors NG1, NG2 receiving the reset signal RST at gates thereof.

The transfer transistor N1A couples the node CZ to the bit line BLA when the word line WLA is in high level. The transfer transistor N2A couples the node CX to the bit line BLAX when the word line WLA is in high level. The transfer transistor N1B couples the node CZ to the bit line BLB when the word line WLB is in high level. The transfer transistor N2B couples the node CX to the bit line BLBX when the word line WLB is in high level.

FIG. 3 illustrates an example of a layout of the memory cell MC illustrated in FIG. 2. A region surrounded by a dashed line is a p-type well region PW where the nMOS transistors are formed or an n-type well region NW where the pMOS transistors are formed. A region surrounded by a dotted line represents an active region where transistors are formed, and a region outside the dotted line represents an element isolation region STI (Shallow Trench Isolation). A half-tone dot meshing region represents a polysilicon wiring POLY.

An overlapped portion between the region surrounded by the dotted line and the polysilicon wiring POLY represents a gate (channel region) of the transistor. A portion which does not overlapped with the polysilicon wiring POLY among the region surrounded by the dotted line represents a diffusion region (a source or a drain of the transistor). A region surrounded by a solid line represents a first metal wiring M1. A square mark with an "X" represents a contact C1 coupling the first metal wiring M1 to the diffusion region, or a contact C1 coupling the first metal wiring M1 to the polysilicon wiring POLY. A heavy square mark with the "X" represents a contact C2 coupling the first metal wiring M1 to a second metal wiring M2 (FIG. 4) or a third metal wiring M3 (FIG. 4) of an upper layer.

In this embodiment, the diffusion regions (dotted lines) forming the transfer transistors N1A, N2A are laid out in a symmetrical form with each other. In other words, a boundary line (dotted line) of the element isolation region STI forming the transfer transistor N1A is coupled to a forming region of the driver transistor ND2 via the short transistor NG1. A boundary line (dotted line) of the element isolation region STI forming the transfer transistor N2A is coupled to the forming region of the driver transistor ND2. This is enabled by commonly using a source (node CZ) of the transfer transistor N1A with a drain (node CZ) of the short transistor NG1. A source (node CX) of the short transistor NG1 is commonly used by a drain (node CX) of the driver transistor ND2.

It may become possible to make channel lengths of the transfer transistors N1A, N2A equal with each other, and to make characteristics of a current between source and drain equal with each other by having the layout as stated above. As a result, deterioration of a write margin of data supplied to the port AP can be prevented. As stated above, the layout to make the characteristics of the transfer transistors N1A, N2A equal is enabled by disposing the short transistor NG1 between the transfer transistor N1A and the driver transistor ND2.

Similarly, diffusion regions (dotted lines) forming the transfer transistors N1B, N2B are also laid out in a synchronous form with each other. Namely, a source (node CX) of the transfer transistor N2B is commonly used by a drain (node CX) of the short transistor NG2. A source (node CZ) of the short transistor NG2 is commonly used by a drain (node CZ) of the driver transistor ND1. A boundary line (dotted line) of the element isolation region STI forming the transfer transistor N1B is coupled to a forming region of the driver transistor ND1. Accordingly, it may become possible to make channel lengths of the transfer transistors N1B, N2B equal with each other, and to make characteristics of a current between source and drain equal with each other. As a result, deterioration of the write margin of data supplied to the port BP can be prevented.

FIG. 4 illustrates an example of a wiring layout of the memory cell MC illustrated in FIG. 3. A heavy wiring extending in a vertical direction of the drawing represents the second metal wiring M2. A heavy wiring extending in a horizontal direction of the drawing represents the third metal wiring M3. Wiring layers of the metal wirings M1, M2, M3 are laminated on a semiconductor substrate in this sequence. The bit lines BLA, BLAX, BLB, BLBX, and power supply lines VDD, VSS are wired in the vertical direction of the drawing. The word lines WLA, WLB, and a reset signal line RST are wired in the horizontal direction of the drawing.

Figure 5:
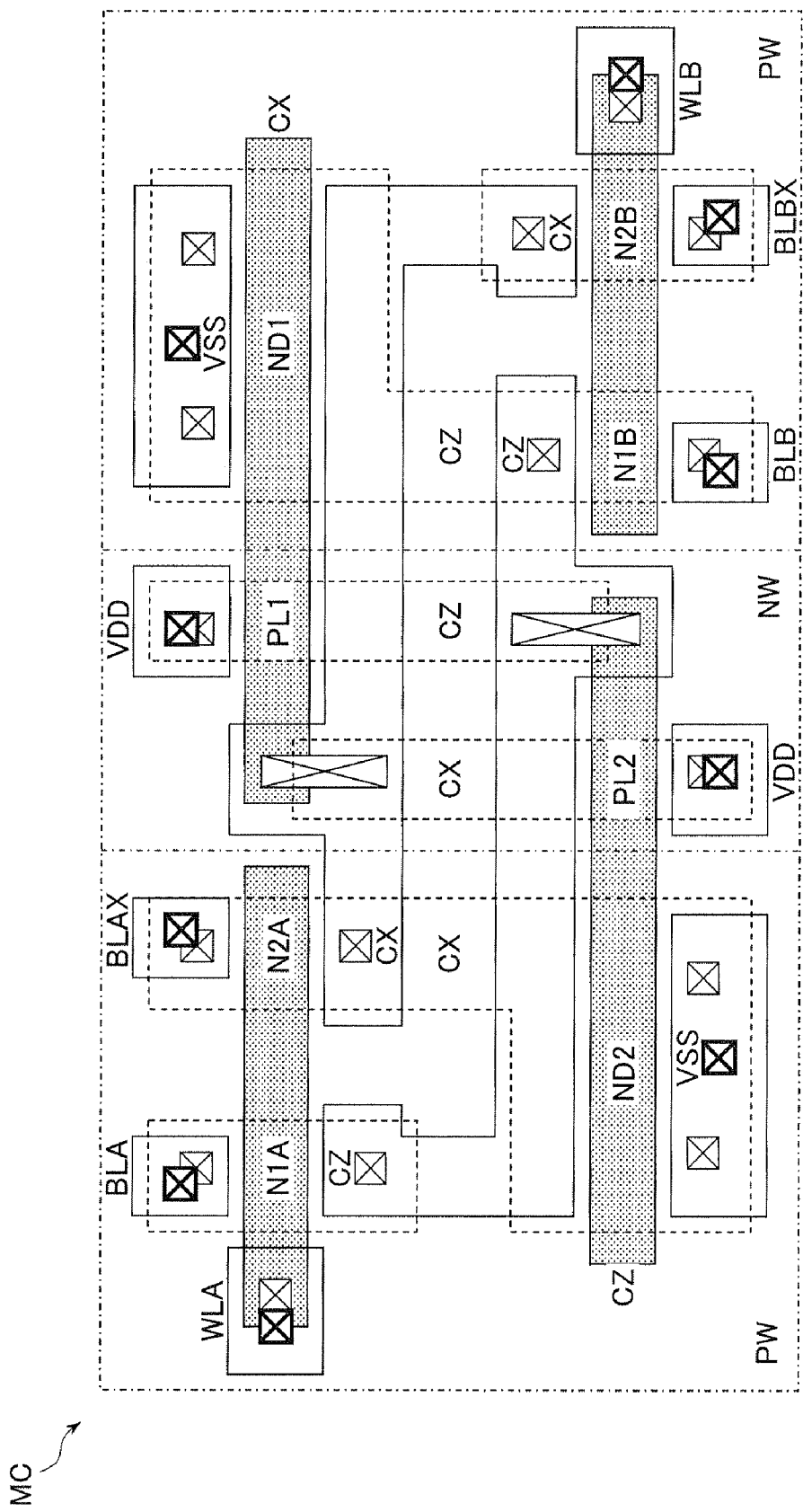
FIG. 5 illustrates another example of a layout of the memory cell.

FIG. 5 illustrates another example of a layout of a memory cell MC. This memory cell MC doesn't have the short transistors NG1, NG2. Accordingly, the diffusion region (dotted line) forming the transfer transistor N1A is independently disposed aside from the diffusion regions (dotted lines) forming the transfer transistor N2A and the driver transistor ND2.

The diffusion regions (dotted lines) forming the transfer transistors N1A, N2A do not have synchronous forms. The channel length of the transfer transistor N1A becomes easy to be large compared to the channel length of the transfer transistor N2A caused by the asymmetry. Accordingly, the current between source and drain of the transfer transistor N1A becomes small, and it becomes difficult to transmit the high level of the bit line BLA to the node CZ. Namely, the write margin of the logical "0" (zero) supplied to the port AP deteriorates.

The diffusion regions (dotted lines) do not have synchronous forms also as for the transfer transistors N1B, N2B. The channel length of the transfer transistor N2B becomes easy to be large compared to the channel length of the transfer transistor N1B caused by the asymmetry. Accordingly, the current between source and drain of the transfer transistor N2B becomes small, and it becomes difficult to transmit the high level of the bit line BLBX to the node CX. Namely, the write margin of the logical "1" supplied to the port BP deteriorates. In general, in the semiconductor memory MEM, the worst write margin of the memory cell becomes the write margin of the semiconductor memory MEM. The semiconductor memory MEM is treated as a bad product if even one of the memory cells MC does not satisfy the write margin. Accordingly, a yield of the semiconductor memory MEM deteriorates resulting from the asymmetry of the transfer transistors N1A, N2A (or N1B, N2B).

FIG. 6 illustrates an example of a substantial part of the memory core 18 illustrated in FIG. 1. FIG. 6 illustrates column switches WCSW, RCSW, the precharge circuit PRE, and the sense amplifier SA corresponding to one bit line pair BLA, BLAX. Namely, circuits corresponding to one data terminal DQA are illustrated. Circuits corresponding to the bit line pair BLB, BLBX are also the same as the circuits in FIG. 6. The column switch CSW (A) illustrated in FIG. 1 has the column switch WCSW for writing and the column switch RCSW for reading. The precharge circuit PRE illustrated in FIG. 1 has a precharge circuit PRE1 and a precharge circuit PRE2 illustrated in FIG. 7.

The column switch WCSW has four switches SW1-SW4. For example, the switches SW1-SW4 are CMOS transmission gates. The switches SW1, SW3 are turned on when a write signal WEX is activated in low level and a column selection signal COL is activated in high level. The write signal WEX is output from the core control circuit 14A when a write command is supplied to the semiconductor memory MEM. The column selection signal COL is selectively output from the column decoder CDEC (A) in synchronous with a column timing signal output from the core control circuit 14A.

A write data line WD is coupled to the bit line BLA resulting from the turning on of the switch SW1. A write data line WDX is coupled to the bit line BLAX resulting from the turning on of the switch SW3. The switches SW2, SW4 are turned on during a period when the reset signal RST is in low level. The write data lines WD, WDX are coupled to the data bus DBA via the write amplifier WA (A). The bit line BLA is coupled to a data line DBL resulting from the turning on of the switch SW2. The bit line BLAX is coupled to a data line DBLX resulting from the turning on of the switch SW4.

The precharge circuit PRE1 has a pMOS transistor coupling the data line DBL to the power supply line VDD, a pMOS transistor coupling the data line DBDX to the power supply line VDD, and a pMOS transistor coupling the data lines DBL, DBLX with each other. The precharge circuit PRE1 precharges the complementary data lines DBL, DBLX to a power supply voltage VDD during a period when an equalize signal EQD in low level is received. The equalize signal EQD in low level is output from the core control circuit 14A during a standby period when the command signal CMDA is not supplied.

The sense amplifier SA has a pair of cMOS inverters of which inputs and outputs are coupled with each other, and an nMOS transistor receiving a signal having the same logic as the reset signal RST at a gate thereof. The sense amplifier SA operates when the reset signal RST is in high level, and amplifies a voltage difference between the data lines DBL, DBLX.

The column switch RCSW has switches SW5, SW6. For example, the switches SW5, SW6 are CMOS transmission gates. The switch SW5 is turned on when the column selection signal COL is activated in high level, and couples the data line DBL to a data bus DB. The switch SW6 is turned on when the column selection signal COL is activated in high level, and couples the data line DBLX to a data bus DBX.

FIG. 7 illustrates an example of a substantial part of the memory core 18 illustrated in FIG. 1. The precharge circuit PRE and the read amplifier RA corresponding to one data terminal DQA are illustrated in FIG. 7. Circuits corresponding to the data terminal DQB are also the same as the circuits in FIG. 7. The precharge circuit PRE2 is the same circuit as the precharge circuit PRE illustrated in FIG. 6. The precharge circuit PRE2 precharges the complementary data buses DB, DBX to the power supply voltage VDD during a period when the equalize signal EQD in low level is received.

The read amplifier RA has driver circuits DRV1, DRV2, and an output circuit OUT. The driver circuit DRV1 transmits a logical level of a signal on the data bus DB to the output circuit OUT while inverting the logical level when a read enable signal RDE is activated in high level. The driver circuit DRV2 transmits a logical level of a signal on the data bus DBX to the output circuit OUT when the read enable signal RDE is activated in high level. The read enable signal RDE is output from the core control circuit 14A when a read command is supplied to the semiconductor memory MEM.

The output circuit OUT has an nMOS transistor N1 which is turned on when high level is received from the driver circuit DRV1, and a pMOS transistor P1 which is turned on when low level is received from the driver circuit DRV2. The output circuit OUT outputs high level to an output terminal SO when the logical levels of the signals on the data buses DB, DBX are in high level, low level, and outputs low level to the output terminal SO when the logical levels of the signals on the data buses DB, DBX are in low level, high level.

FIG. 8 illustrates an outline of the memory core 18 illustrated in FIG. 1. FIG. 8 illustrates circuits and signal lines relating to the port AP, and circuits and signal lines relating to the port BP are not illustrated. Incidentally, the outline of the memory core 18 is the same as FIG. 8 when the semiconductor memory MEM is a single port memory having the port AP. In this example, the memory cell array ARY has four memory cells MC1, MC2, MC3, MC4. Values illustrated with parentheses in the memory cells MC1-MC4 represent changes of data stored in the memory cells MC1-MC4 during access operations illustrated in FIG. 9. Specifically, in FIG. 9, a data D5 is written to the memory cell MC1 storing a data D1, and a data D6 is written to the memory cell MC4 storing a data D4.

A word line WLA1 is coupled to the memory cells MC1, MC2, and a word line WLA2 is coupled to the memory cells MC3, MC4. Complementary bit line pair BLA1, BLA1X is coupled to the memory cells MC1, MC3, and a column switch WCSW1. Complementary bit line pair BLA2, BLA2X is coupled to the memory cells MC2, MC4, and a column switch WCSW2.

The column switch WCSW1 receives the write signal WEX and a column selection signal COL1. The column switch WCSW2 receives the write signal WEX and a column selection signal COL2. The column selection signal COL1 is set at high level when the bit line pair BLA1, BLA1X is selected. The column selection signal COL2 is set at high level when the bit line pair BLA2, BLA2X is selected.

The column switches WCSW1-2 are coupled to the common write data lines WD, WDX, and receive the common reset signal RST. The data lines DBL1, DBL1X are coupled to the column switch WCSW1, a column switch RCSW1, and a sense amplifier SA1. The data lines DBL2, DBL2X are coupled to the column switch WCSW2, a column switch RCSW2, and a sense amplifier SA2. The column switch RCSW1 receives the column selection signal COL1 The column switch RCSW2 receives the column selection signal COL2. The sense amplifiers SA1-2 receive the common reset signal RST.

Figure 9:
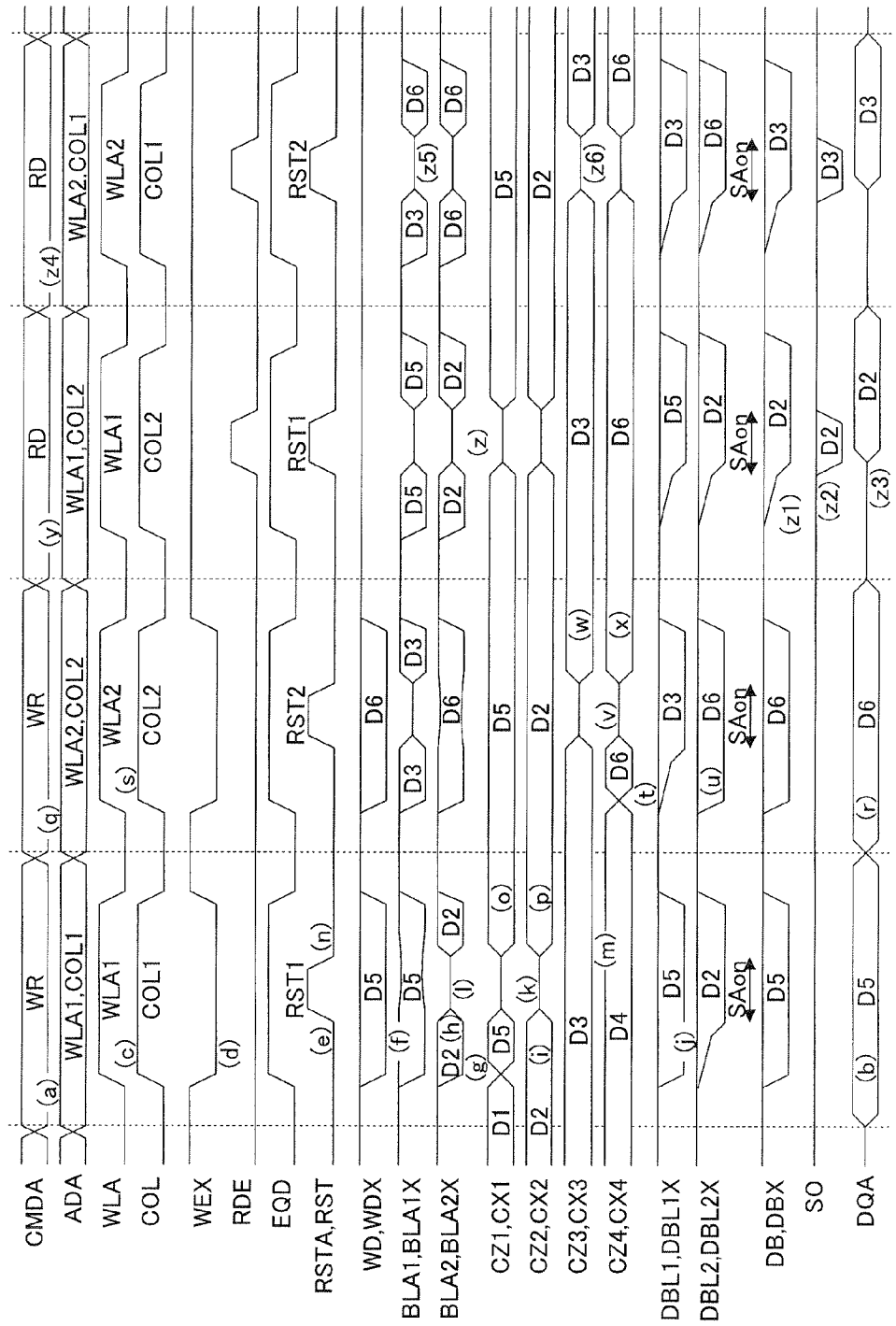
FIG. 9 illustrates an example of access operations of the semiconductor memory illustrated in FIG. 1.

FIG. 9 illustrates an example of access operations of the semiconductor memory MEM illustrated in FIG. 1. In this example, the data D5, D6 are sequentially written to the memory cells MC1, MC4 illustrated in FIG. 8, and thereafter, data are sequentially read out of the memory cells MC2, MC3. The memory cells MC1-MC4 respectively store the data D1-D4 before the access operation. In FIG. 9, waveforms of signals corresponding to the port AP are illustrated, and waveforms of signals corresponding to the port BP are not illustrated. Besides, plural signals are illustrated as one waveform in bulk as for each of a word line signal WLA, the column selection signal COL, and the reset signal RST. Incidentally, the access operations of the semiconductor memory MEM are the same as FIG. 9 when the semiconductor memory MEM is the single port memory having the port AP.

At first, the semiconductor memory MEM receives an address signal ADA to select the word line WLA1 and a column selection line COL1, and the write data D5 together with a write command WR (FIG. 9 (a, b)). The row decoder RDEC (A) activates the word line WLA1, and the column decoder CDEC (A) activates the column selection signal COL1 to select the bit line pair BLA1, BLA1X (FIG. 9 (c)). The core control circuit 14A outputs the write signal WEX, the equalize signal EQD, and the reset signal RSTA (FIG. 9 (d)). The row decoder RDEC (A) generates a reset signal RST1 corresponding to the word line WLA1 in synchronous with the reset signal RST from the OR circuit based on the row address signal RAA (FIG. 9 (e)). An activation period of the reset signals RST, RST1 is included in an activation period of the word line WLA (namely, an on period of the transfer transistors N1A, N2A).

The column switch WCSW1 illustrated in FIG. 8 transfers the write data D5 on the complementary write data lines WD, WDX to the bit line pair BLA1, BLA1X in synchronous with the write signal WEX and the column selection signal COL1 (FIG. 9 (f)). The transfer transistors N1A, N2A of the memory cell MC1 are turned on, a storage node CZ1 is coupled to the bit line BLA1, and a storage node CX1 is coupled to the bit line BLA1X resulting from the activation of the word line WLA1. Accordingly, the data D1 stored in the storage nodes CZ1, CX1 is rewritten by the data D5 (FIG. 9 (g)).

Besides, the transfer transistors N1A, N2A of the memory cell MC2 are turned on resulting from the activation of the word line WLA1. Accordingly, the data D2 stored in storage nodes CZ2, CX2 are respectively transferred to the bit lines BLA2, BLA2X (FIG. 9 (h)). The switches SW1, SW3 of the column switch WCSW2 (FIG. 6) are turned off, and therefore, the data D2 stored in the storage nodes CZ1, CX1 are kept stored (FIG. 9 (i)). The switches SW2, SW4 of the column switches WCSW1-2 (FIG. 6) are turned on during a period when the reset signal RST1 is in low level. Accordingly, the write data D5 on the bit line pair BLA1, BLA1X is transferred to the data lines DBL1, DBL1X during the period when the reset signal RST1 is in low level. The data D2 on the bit line pair BLA2, BLA2X is transferred to the data line pair DBL2, DBL2X during the period when the reset signal RST1 is in low level (FIG. 9 (j)).

The storage nodes CZ1, CX1 are coupled with each other, and the data D5 written to the memory cell MC1 is lost when the reset signal RST1 is activated in high level (FIG. 9 (k)). Similarly, the storage nodes CZ2, CX2 are coupled with each other, and the data D2 stored in the memory cell MC2 is lost. The switches SW2, SW4 illustrated in FIG. 6 are turned off resulting from the activation of the reset signal RST1. The sense amplifiers SA1-2 illustrated in FIG. 8 are activated resulting from the activation of the reset signal RST1, and differentially amplify the data D5 on the data line pair DBL1, DBL1X, and the data D2 on the data line pair DBL2, DBL2X respectively. Arrows in the drawing represent on periods SAon of the sense amplifier SA. Accordingly, the data D5, D2 stored in the memory cells MC1, MC2 are temporary put aside into the sense amplifiers SA1, SA2.

The bit line pair BLA1, BLA1X receive the write data D5 via the column switch WCSW1. Accordingly, a voltage level of the bit line pair BLA1, BLA1X is seldom affected by shorts of the storage nodes CZ1, CX1. On the other hand, the switches SW1, SW3 of the corresponding column switch WCSW2 are turned off as for the bit line pair BLA2, BLA2X. Accordingly, a voltage level of the bit line pair BLA2, BLA2X changes into a middle level affected by shorts of the storage nodes CZ2, CX2 (FIG. 9 (l)).

The data lines DBL2, DBL2X are cut off from the bit line pair BLA2, BLA2X resulting from the turning off of the switches SW2, SW4. Accordingly, the voltage of the data lines DBL2, DBL2X is not affected by the change of the voltage level of the bit line pair BLA2, BLA2X. Namely, the data lines DBL2, DBL2X are not affected by the shorts of the storage nodes CZ2, CX2. The sense amplifier SA starts an amplification of the voltage difference on the data lines DBL2, DBL2X. The word line WLA2 and a reset signal RST2 are not activated, and therefore, the data D3, D4 stored in the memory cells MC3, MC4 are kept stored (FIG. 9 (m)).

The reset signal RST1 is inactivated in low level, and the short states of the storage nodes CZ1, CX1 are released, and the short states of the storage nodes CZ2, CX2 are released (FIG. 9 (n)). Accordingly, the data D5 on the bit line pair BLA1, BLA1X is rewritten to the memory cell MC1 (FIG. 9 (o)). The switches SW2, SW4 are turned on resulting from the inactivation of the reset signal RST1. The sense amplifier SA stops the amplification operation in synchronous with the inactivation of the reset signal RST1. The bit line pair BLA2, BLA2X recovers to a level representing the data D2 by receiving the voltage level on the data lines DBL2, DBL2X amplified by the sense amplifier SA. The data D2 on the bit line pair BLA2, BLA2X is rewritten to the memory cell MC2, and the write operation completes (FIG. 9 (p)).

As stated above, the sense amplifier SA functions as a rewrite circuit rewriting the data D2 to the memory cell MC2 which is not accessed at the write operation time. When the reset signal RST is activated, the storage nodes CZ2, CX2 are equalized by the short operation, and set at the same voltage with each other. Accordingly, it may be possible to rewrite the data D2 to the memory cell MC2 generally by an electric charge of the data line pair DBL2, DBL2X even if the sense amplifier SA is inactivated and the electric charge is not supplied to the bit line pair BLA2, BLA2X. It may be similarly possible to rewrite the data D5 to the memory cell MC1 generally by the electric charge of the data line pair DBL1, DBL1X as for the rewrite of the memory cell MC1.

Next, the semiconductor memory MEM receives the address signal ADA to select the word line WLA2 and a column selection line COL2 and the write data D6 together with a second write command WR (FIG. 9 (q, r)). Accordingly, the word line WLA2 and the column selection signal COL2 are activated (FIG. 9 (s)). The write data D6 on the write data line pair WD, WDX is written to storage nodes CZ4, CX4 via the bit line pair BLA2, BLA2X, and further, transferred to the data line pair DBL2, DBL2X (FIG. 9 (t, u)).

After that, the reset signal RST2 is activated, storage nodes CZ3, CX3 are shorted, and the storage nodes CZ4, CX4 are shorted (FIG. 9 (v)). The data D3, D6 stored in the memory cells MC3, MC4 are temporary put aside by the sense amplifier SA operating in response to the activation of the reset signal RST2. The data D3 on the data line pair DBL1, DBL1X is rewritten to the memory cell MC3 in response to the inactivation of the reset signal RST2 (FIG. 9 (w)) as same as the above description. The data D6 on the data lines DBL2, DBL2X is rewritten to the memory cell MC4 (FIG. 9(x)).

Next, the semiconductor memory MEM receives the address signal ADA to select the word line WLA1 and the column selection line COL2 together with the read command RD (FIG. 9 (y)). In the read operation, all of the sense amplifiers SA function as the above-stated rewrite circuits. Namely, the data D5, D2 stored in the memory cells MC1, MC2 are put aside into the sense amplifier SA in response to the activation of the reset signal RST1, and rewritten to the memory cells MC1, MC2 in response to the inactivation of the rest signal RST1 (FIG. 9(z)).

The read data D2 amplified by the sense amplifier SA is transferred to the complementary data buses DB, DBX via the column switch RCSW2 illustrated in FIG. 8 (FIG. 9 (z1)). The read amplifier RA illustrated in FIG. 7 outputs the read data D2 on the data buses DB, DBX to the output terminal SO (FIG. 9 (z2)). The read data D2 is output from the data terminal DQA, and the read operation completes (FIG. 9 (z3)). Incidentally, the core control circuits 14A, 14B may disable the activation of the reset signal RST (RSTA, RSTB) at the read operation time.

Next, the semiconductor memory MEM receives the address signal ADA to select the word line WLA2 and the column selection line COL1 together with the read command RD (FIG. 9 (z4)). The data D3, D6 stored in the memory cells MC3, MC4 are put aside into the sense amplifier SA in response to the activation of the reset signal RST2, and rewritten to the memory cells MC3, MC4 in response to the inactivation of the reset signal RST2 (FIG. 9 (z5, z6)).

As stated above, in this embodiment, the transfer transistor N1A (N2B), the short transistor NG1 (NG2), and the driver transistor ND2 (ND1) are continuously disposed via the common diffusion layer CZ (CX), and thereby, the variation of characteristics of the transfer transistor N1A (N2B) can be prevented. Accordingly, it may be possible to prevent that current supplying ability of the transfer transistor N1A (N2B) changes depending on the layout in the memory cell MC. Consequently, the deterioration of the operation margin of the semiconductor memory MEM can be prevented. As a result, it may be possible to surely write the data to the memory cell MC, and to surely store the data written to the memory cell MC.

It may be possible to store the data to the sense amplifier SA during the reset signal RST is activated, and to rewrite the data from the sense amplifier SA to the memory cell MC in response to the inactivation of the reset signal RST. As a result, it may be possible to prevent the deterioration of the operation margin of the semiconductor memory MEM and to surely write the data to the memory cell MC even when the complementary storage nodes CZ, CX are shorted with each other by the short transistors NG1, NG2. Besides, the data stored in the memory cell MC can surely be stored even when the short transistors NG1, NG2 of the memory cell MC to which the data is not written are turned on by the reset signal RST. Further, it may be possible to prevent that the data stored in the memory cell MC is lost after the reset period whether data is read out or not read out from the memory cell MC.

Figure 10:
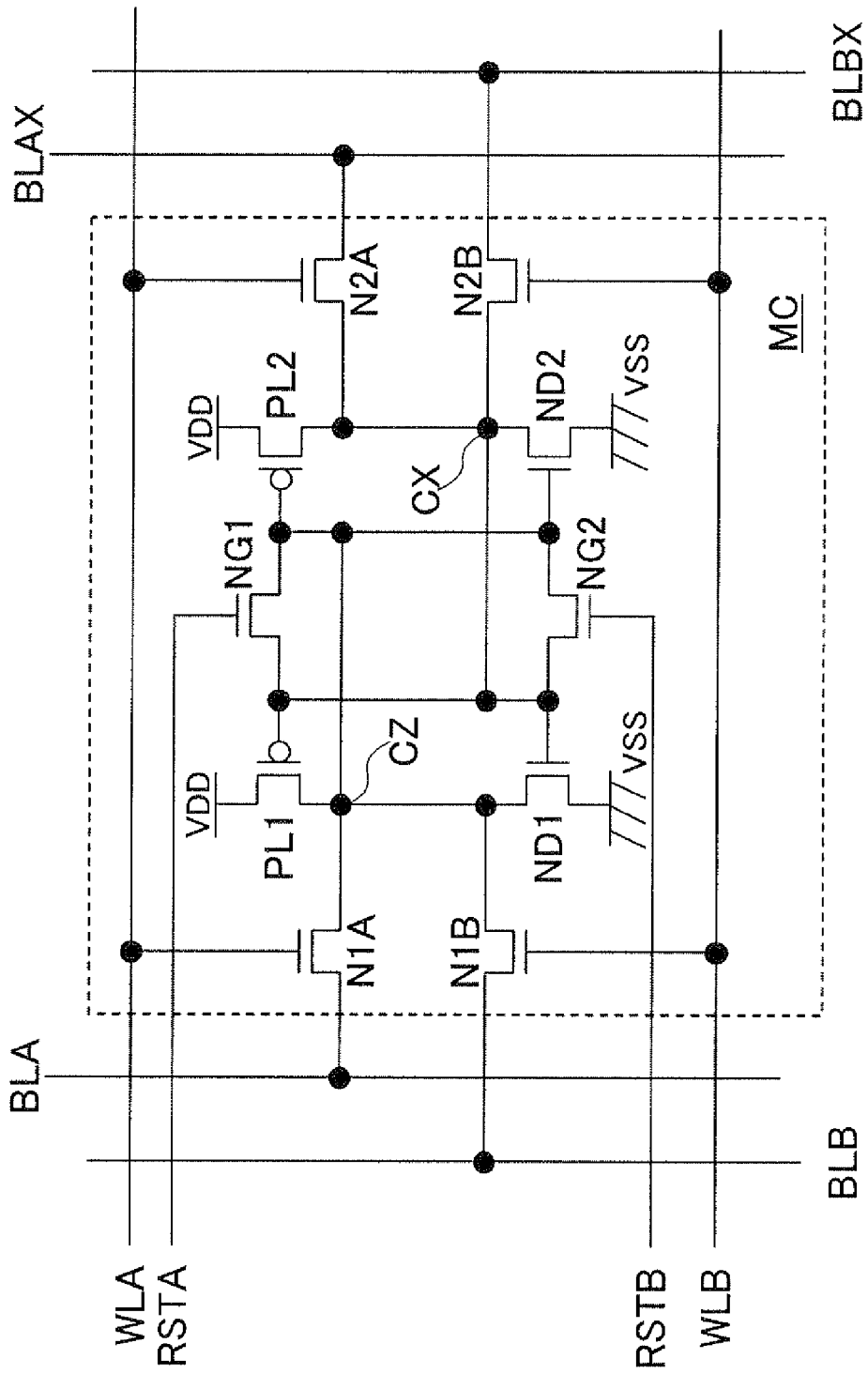
FIG. 10 illustrates an example of a memory cell in another embodiment.

FIG. 10 illustrates an example of a memory cell MC in another embodiment. The same reference symbols are added to designate the same and corresponding elements described in the above-stated embodiment, and the detailed description thereof will not be given. The memory cell MC is disposed in the memory cell array ARY illustrated in FIG. 1. The semiconductor memory MEM is the same as FIG. 1 except that the reset signals RSTA, RSTB are directly supplied to the row decoders RDEC (A)/(B) without passing through the OR circuit. Namely, the semiconductor memory MEM is a static RAM in multiport type. The semiconductor memory MEM may operate in synchronous with the clock signal, or in asynchronous with the clock signal. The semiconductor memory MEM may be designed as a memory macro (IP) mounted on a system LSI and so on, or as a semiconductor storage device sealed in a package.

In this embodiment, the short transistors NG1, NG2 respectively receive the reset signals RSTA, RSTB to operate. Here, the reset signals RSTA, RSTB are signals in which the reset signals RSTA, RSTB output from the core control circuits 14A, 14B illustrated in FIG. 1 are divided in accordance with the row address signals RAA, RAB. Namely, plural reset signals RSTA are respectively wired with correspond to the word lines WLA. Respective reset signal lines RSTA are commonly coupled to plural memory cell groups MC coupled to the respective word lines WLA. The plural reset signals RSTB are respectively wired with correspond to the word lines WLB. Respective reset signal lines RSTB are commonly coupled to the plural memory cell groups MC coupled to the respective word lines WLB. The other constitution of the memory cell MC is the same as FIG. 2.

Figure 11:
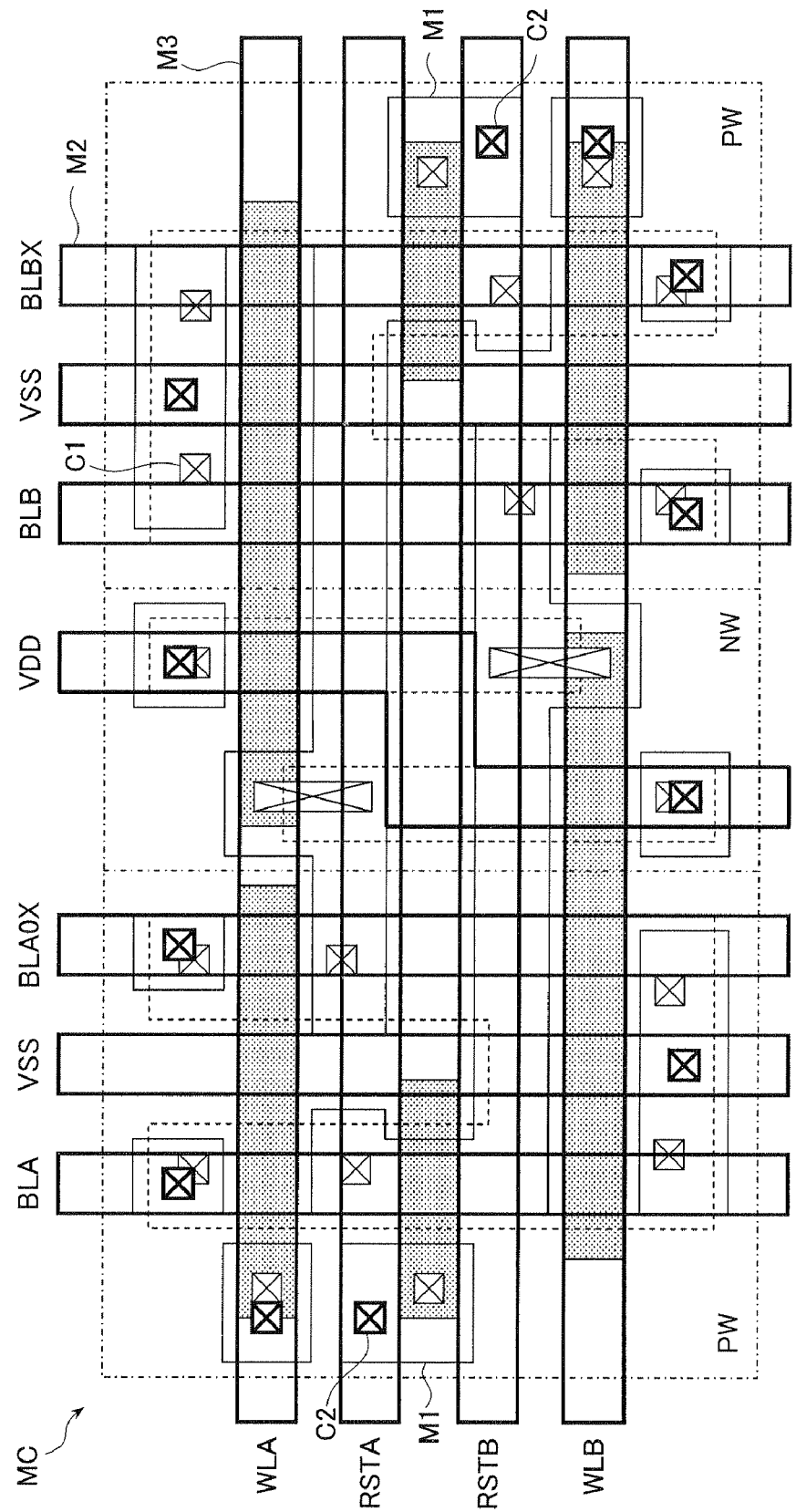
FIG. 11 illustrates an example of a wiring layout of the memory cell illustrated in FIG. 10.

FIG. 11 illustrates an example of a wiring layout of the memory cell MC illustrated in FIG. 10. Detailed descriptions are not given as for the same elements as FIG. 4. A difference from FIG. 4 is that two reset signals RSTA, RSTB are wired between the word lines WLA, WLB. The layout from a semiconductor substrate to the second metal wiring M2 is the same as FIG. 4 except a size of the first metal wiring M1 coupled to the reset signal lines RSTA, RSTB and a position of the contact C2 coupled to the reset signal lines RSTA, RSTB. Incidentally, the reset signal lines RSTA, RSTB may be wired by using a fourth metal wiring layer positioning above the third metal wiring layer M3 when there is no space to wire the reset signal lines RSTA, RSTB between the word lines WLA, WLB. The similar effect as the above-stated embodiment can also be obtained in this embodiment.

Figure 12:
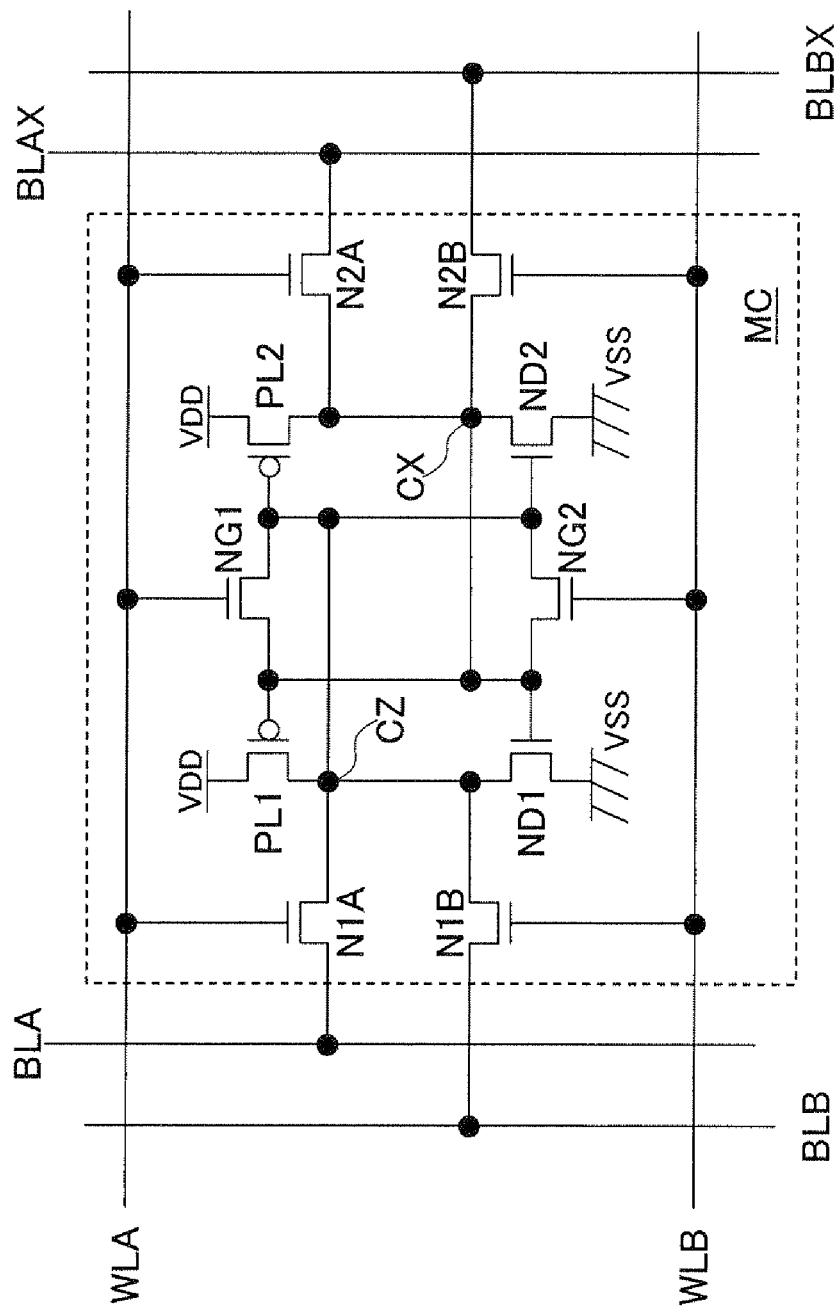
FIG. 12 illustrates an example of a memory cell in still another embodiment.

FIG. 12 illustrates an example of a memory cell MC in still another embodiment. The same reference symbols are added to designate the same and corresponding elements described in the above-stated embodiments, and the detailed description thereof will not be given. The memory cell MC is disposed in the memory cell array ARY illustrated in FIG. 1. The semiconductor memory MEM is the same as FIG. 1 except that the core control circuits 14A, 14B do not generate the reset signals RSTA, RSTB, and the OR circuit is not formed. Namely, the semiconductor memory MEM is a static RAM in multiport type. The semiconductor memory MEM may operate in synchronous with the clock signal, or in asynchronous with the clock signal. The semiconductor memory MEM may be designed as a memory macro (IP) mounted on a system LSI and so on, or as a semiconductor storage device sealed in a package.

In this embodiment, gates of the short transistors NG1, NG2 are respectively coupled to the word lines WLA, WLB. Accordingly, the memory cell MC does not receive the reset signal RST. In other words, signals respectively supplied to the word lines WLA, WLB also function as the reset signals. The other constitution of the memory cell MC is the same as FIG. 2 except a transistor size.

Figure 13:
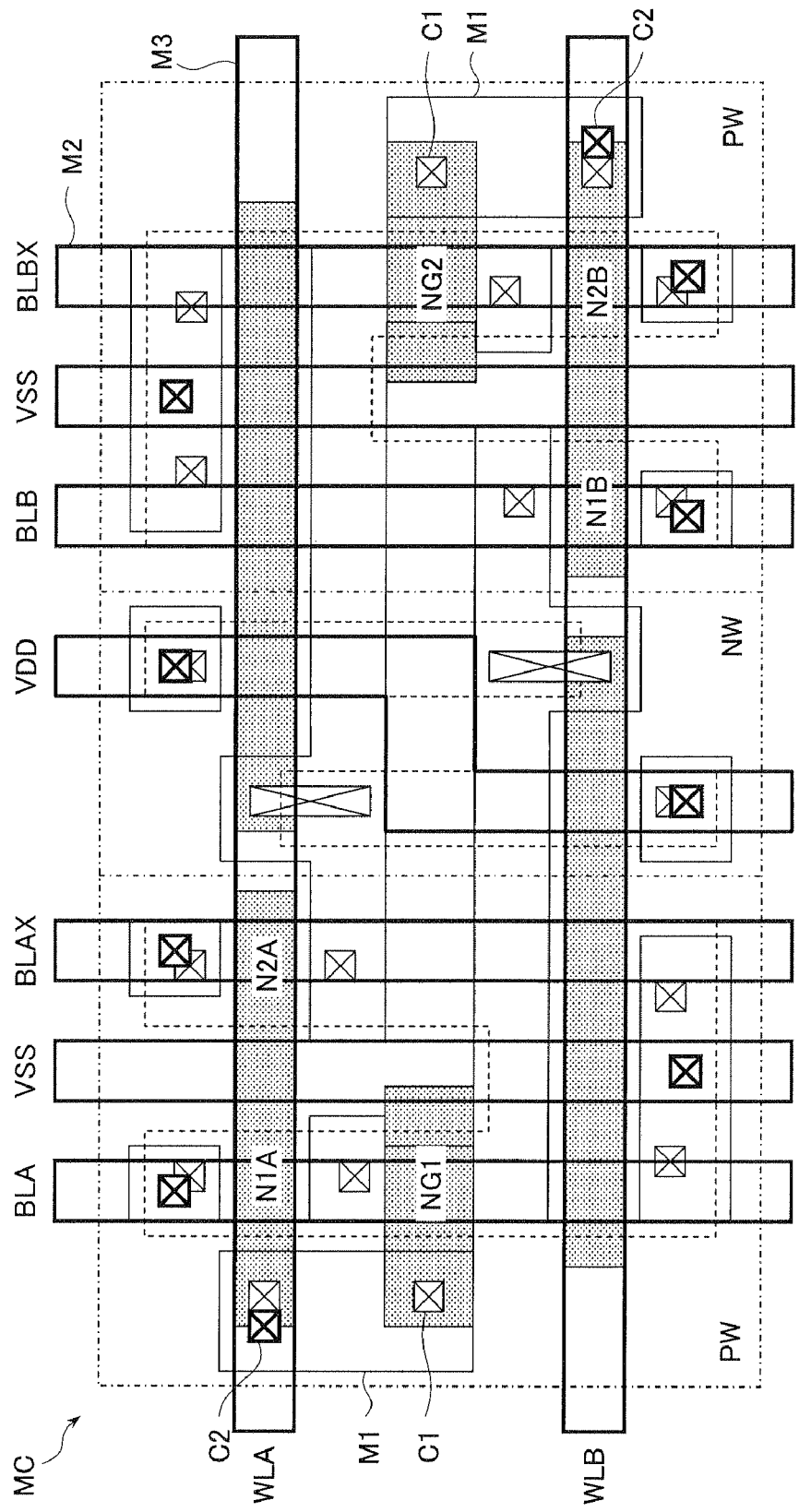
FIG. 13 illustrates an example of a wiring layout of the memory cell illustrated in FIG. 12.

FIG. 13 illustrates an example of a wiring layout of the memory cell MC illustrated in FIG. 12. Detailed descriptions are not given as for the same elements as FIG. 4. In this embodiment, the gate of the short transistor NG1 is coupled to the word line WLA via the contact C1, the first metal wiring M1, and the contact C2. The gate of the short transistor NG2 is coupled to the word line WLB via the contact C1, the first metal wiring M1, and the contact C2. The reset signal line RSTA is not wired. The channel lengths of the short transistors NG1, NG2 are formed larger than those in FIG. 4. Accordingly, threshold voltages of the short transistors NG1, NG2 are manufactured to be higher than threshold voltages of the transfer transistors N1A, N2A, N1B, N2B. Incidentally, the threshold voltages of the short transistors NG1, NG2 may be made higher by adjusting a doze amount of ion injected into channel regions of the short transistors NG1, NG2.

Figure 14:
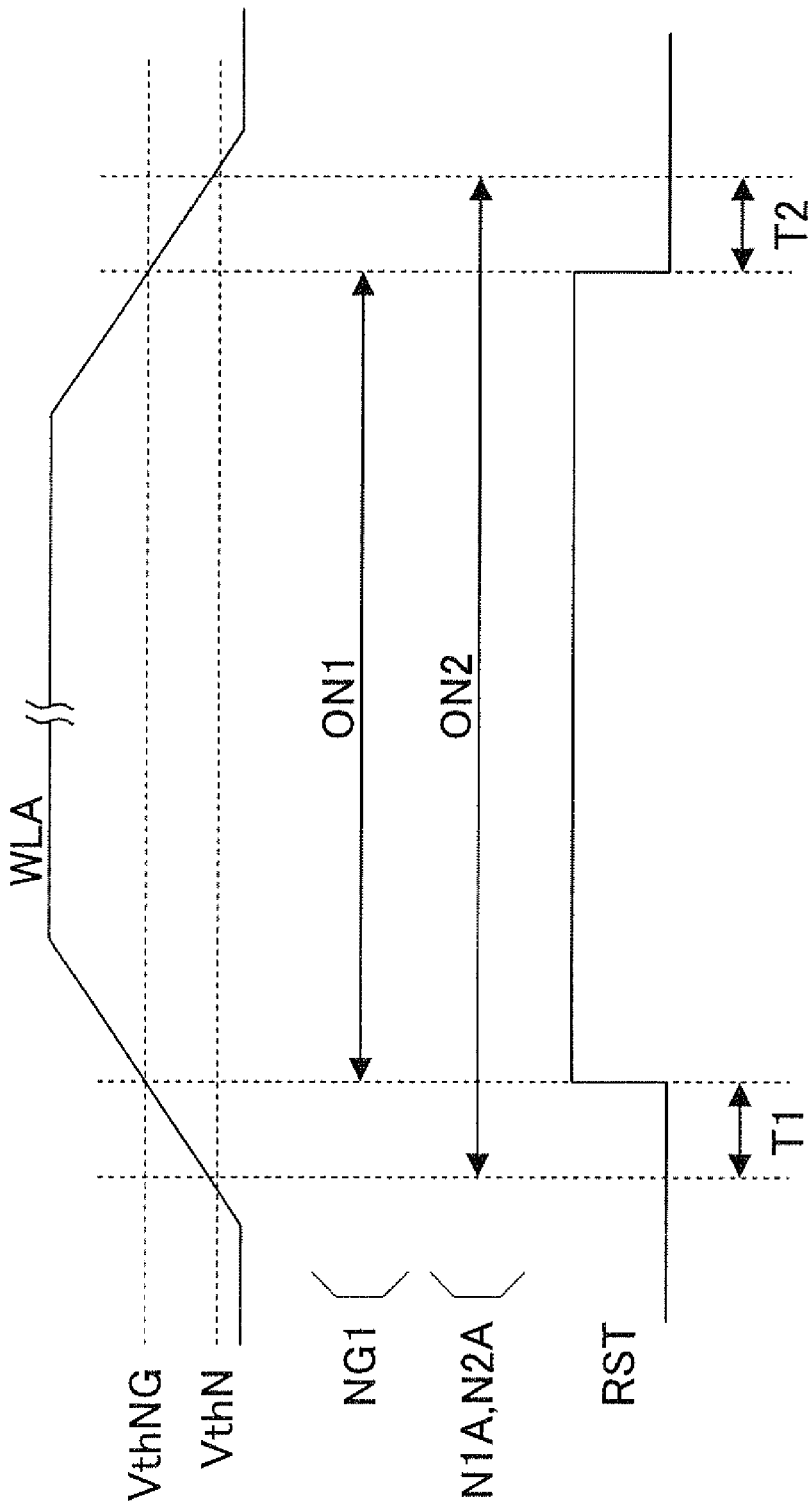
FIG. 14 illustrates an example of operations of the memory cell illustrated in FIG. 12.

FIG. 14 illustrates an example of operations of the memory cell MC illustrated in FIG. 12. For example, the word line WLA is activated in the write operation and the read operation. An on period ON1 of the short transistor NG1 of which threshold voltage VthNG is high is included in an on period ON2 of the transfer transistors N1A, N2A of which threshold voltage VthN is low. The activation period of the reset signal RST operating the switches SW2, SW4, and the sense amplifier illustrated in FIG. 6 is set to be equal to the on period ON1.

A time T1 from the transfer transistors N1A, N2A are turned on to the short transistor NG1 is turned on is a time to put aside the data on the bit lines BLA, BLAX into the sense amplifier SA. In particular, the time T1 is a time to put aside the data read on the bit lines BLA, BLAX from the memory cell MC to which the data is not written into the sense amplifier SA in the write operation. Otherwise, the time T1 is a time to put aside the data read on the bit lines BLA, BLAX from the memory cell MC into the sense amplifier SA in the read operation. A time T2 from the short transistor NG1 is turned off to the transfer transistors N1A, N2A are turned off is a time to rewrite the data put aside into the sense amplifier SA to the memory cell MC via the bit lines BLA, BLAX.

Figure 15:
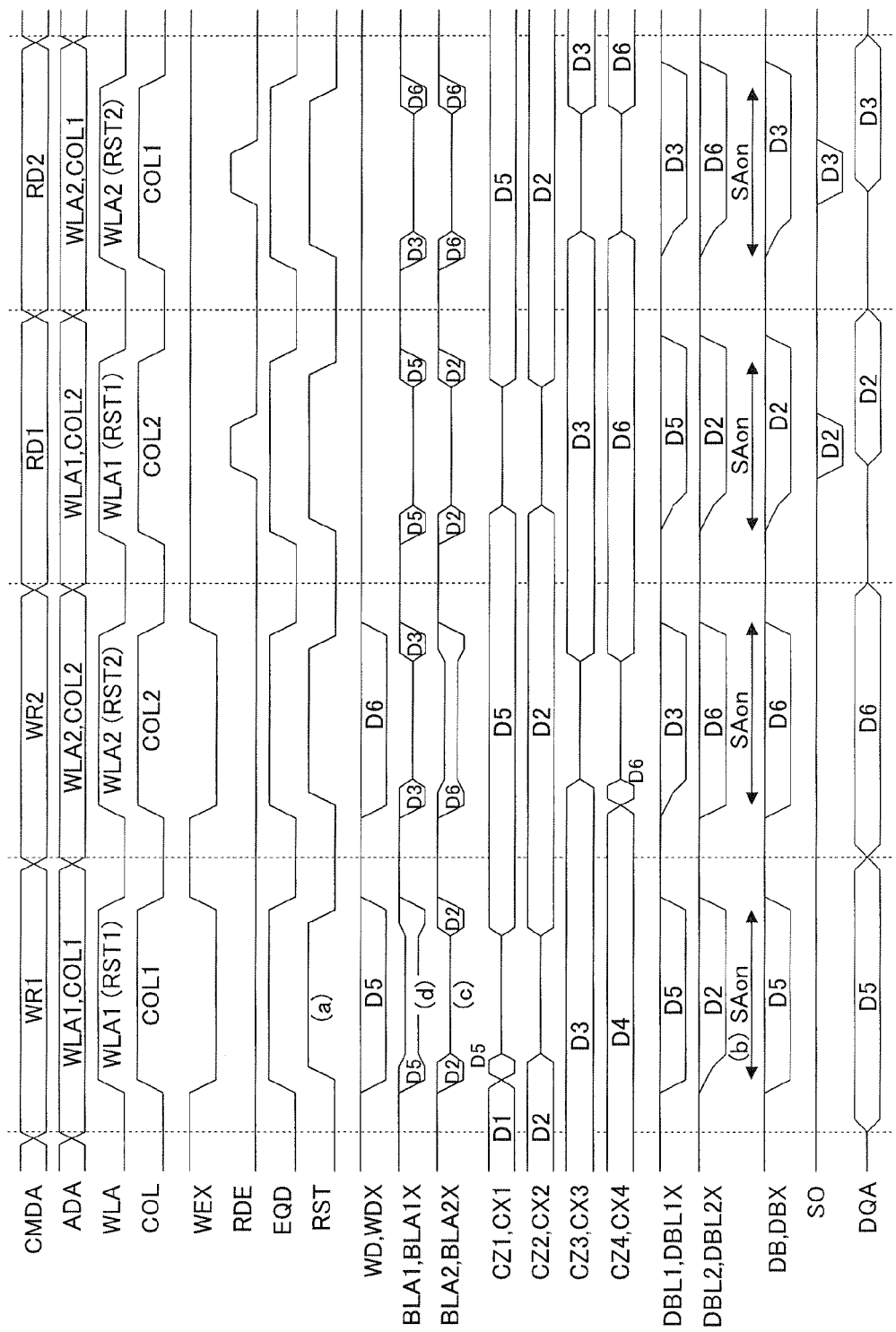
FIG. 15 illustrates an example of access operations of a semiconductor memory having the memory cell illustrated in FIG. 12.

FIG. 15 illustrates an example of access operations of a semiconductor memory MEM having the memory cell MC illustrated in FIG. 12. Detailed descriptions are not give as for the same operations as FIG. 9. Sequence of the write operation and the read operation, the memory cell MC to be accessed, and the data to be read/written are the same as FIG. 8 and FIG. 9.

In this embodiment, the word line signal WLA functions also as the reset signal RST turning on the short transistors NG1, NG2. Accordingly, the on period of the short transistors NG1, NG2 is longer than FIG. 9. The waveform of the reset signal RST determining the on/off timing of the switches SW2, SW4 illustrated in FIG. 6 and the operation timing of the sense amplifier SA is the same as FIG. 14 (FIG. 15 (a)). Namely, the on period SAon of the sense amplifier SA is longer than FIG. 9 (FIG. 15 (b)). The on period of the short transistors NG1, NG2 is long, and therefore, the period when the bit line pair BLA2, BLA2X to which the write operation is not executed changes to the middle level is also long (FIG. 15 (c)).

The bit line pair BLA1, BLA1X receives the write data D5 via the column switch WCSW1. Accordingly, the voltage level of the bit line pair BLA1, BLA1X does not change up to the middle level (FIG. 15 (d)). The read operation is the same as FIG. 9 except that the on period of the short transistors NG1, NG2 and the on period SAon of the sense amplifier SA are long.

The similar effect as the above-stated embodiments can also be obtained in this embodiment. Further, it may not be necessary to wire the reset signal RST illustrated in FIG. 2 to the memory cell array ARY by using the word line signals WLA, WLB as the signal turning on the short transistors NG1, NG2. Besides, the threshold voltage VthNG of the short transistors NG1, NG2 is manufactured to be higher than the threshold voltage VthN of the transfer transistors N1A, N2A, N1B, N2B. Accordingly, it may be possible to surely put aside the data of the memory cell MC into the sense amplifier SA, and to surely rewrite the data from the sense amplifier SA to the memory cell MC.

Figure 16:
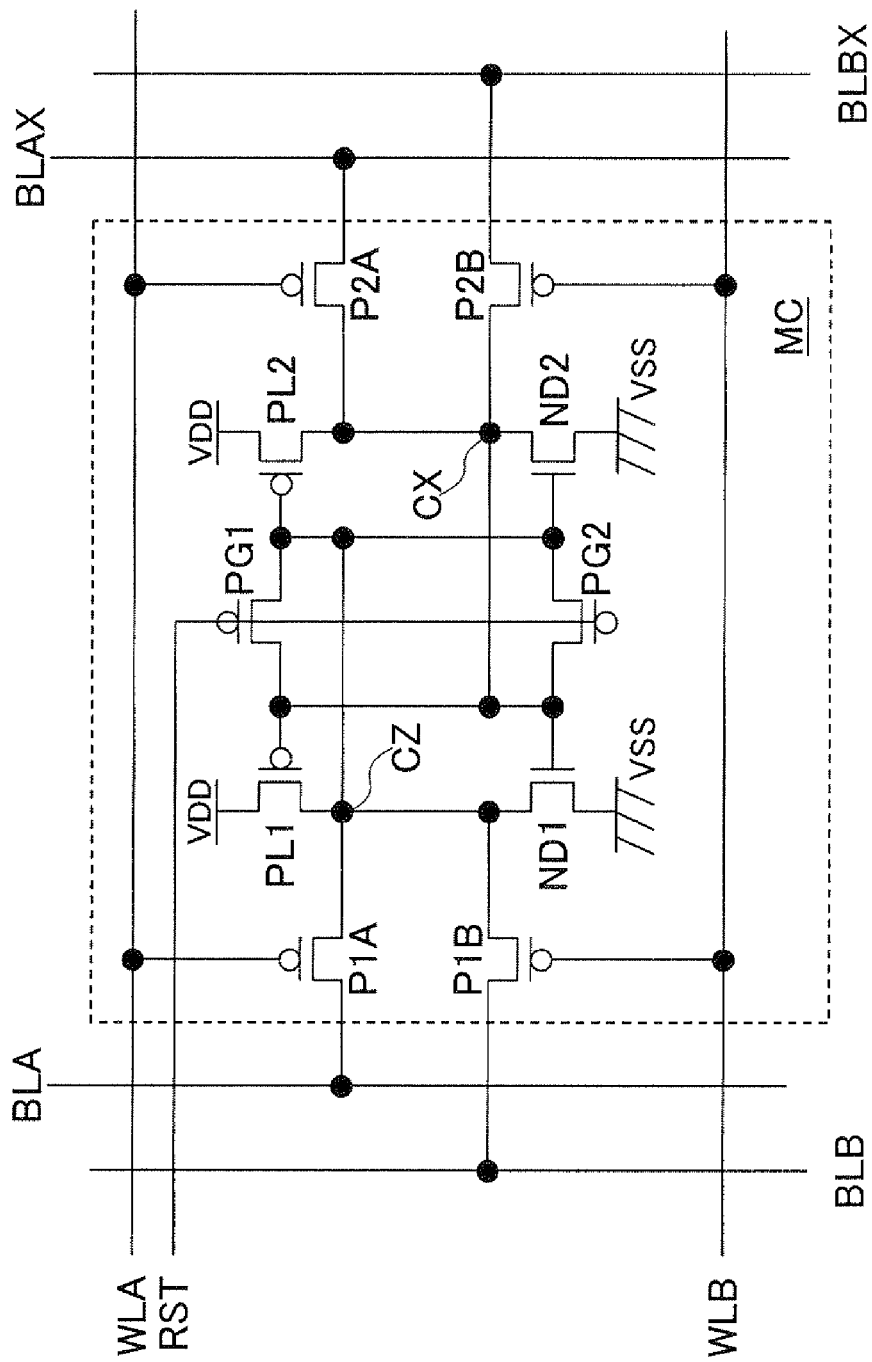
FIG. 16 illustrates an example of a memory cell in still another embodiment.

FIG. 16 illustrates an example of a memory cell MC in still another embodiment. The same reference symbols are added to designate the same and corresponding elements described in the above-stated embodiments, and the detailed description thereof will not be given. The memory cell MC is disposed in the memory cell array ARY illustrated in FIG. 1. The semiconductor memory MEM is the same as FIG. 1 except that the memory cell MC is different, and the word line signals WLA, WLB and the reset signal RST are negative logics. Namely, the semiconductor memory MEM is a static RAM in multiport type. The semiconductor memory MEM may operate in synchronous with the clock signal, or in asynchronous with the clock signal. The semiconductor memory MEM may be designed as a memory macro (IP) mounted on a system LSI and so on, or as a semiconductor storage device sealed in a package.

In this embodiment, transfer transistors P1A, P2A, P1B, P2B, and short transistors PG1, PG2 are pMOS transistors. The other constitution of the memory cell MC is the same as FIG. 2.

Figure 17:
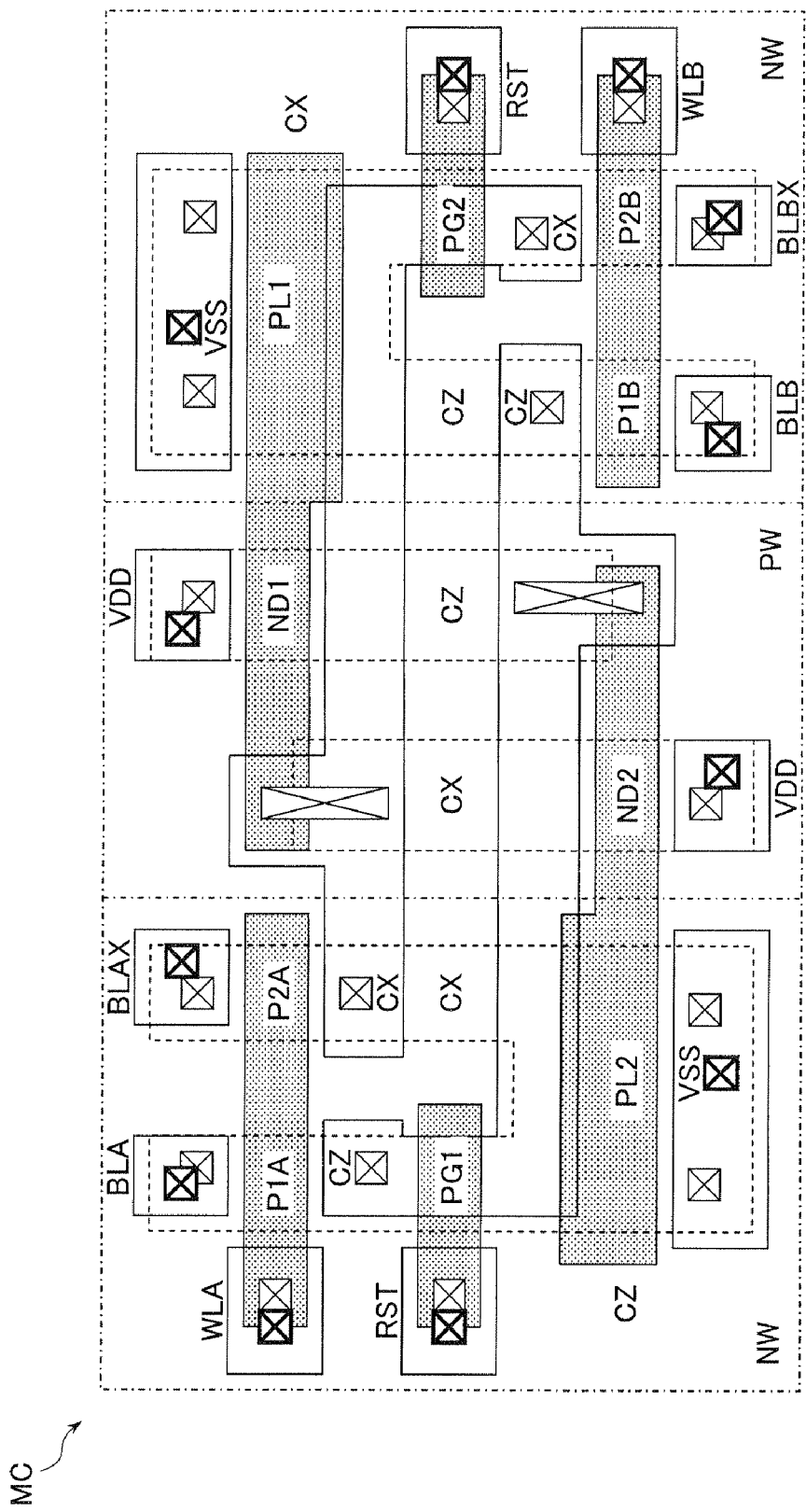
FIG. 17 illustrates an example of a layout of the memory cell illustrated in FIG. 16.

FIG. 17 illustrates an example of a layout of the memory cell illustrated in FIG. 16. Detailed descriptions are not given as for the same elements as FIG. 3. In this embodiment, the p-type well region PW and the n-type well region NW are replaced relative to FIG. 3. Besides, the load transistors PL1, PL2 are respectively formed at the n-type well regions NW at both sides of the memory cell MC. The driver transistors ND1, ND2 are formed at the p-type well region PW at a center of the memory cell MC.

Gate widths or channel lengths of the load transistors PL1, PL2, the transfer transistors P1A, P2A, P1B, P2B, the driver transistors ND1, ND2 and the short transistors PG1, PG2 are changed to obtain the current characteristics equal to FIG. 3. Accordingly, horizontal widths of the p-type well region PW and the n-type well region NW are different from FIG. 3.

Figure 18:
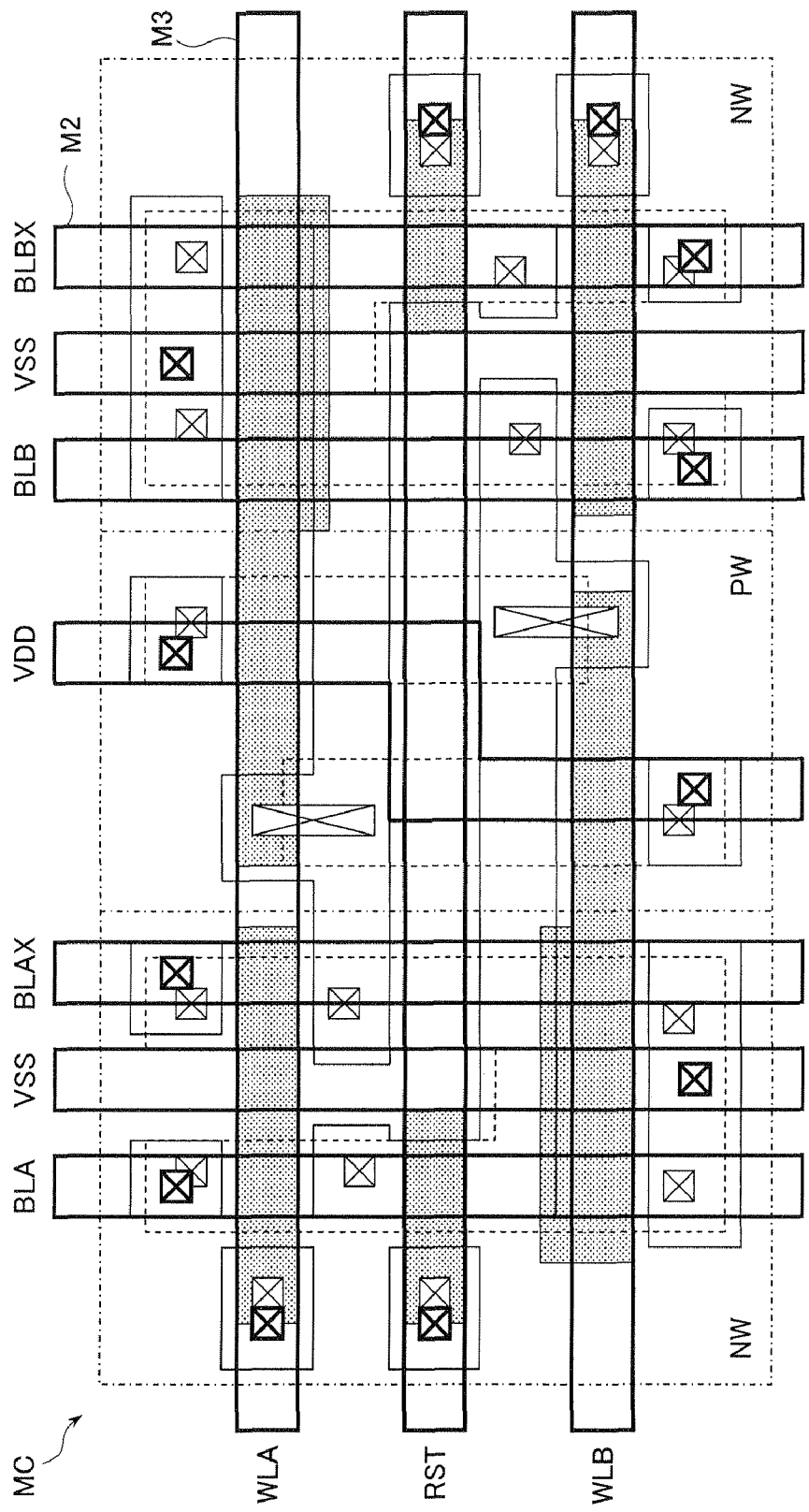
FIG. 18 illustrates an example of a wiring layout of the memory cell illustrated in FIG. 17.

FIG. 18 illustrates an example of a wiring layout of the memory cell MC illustrated in FIG. 17. Detailed descriptions are not given as for the same elements as FIG. 4. In this example, the second metal wirings M2 are disposed in accordance with the horizontal widths of the p-type well region PW and the n-type well regions NW.

Figure 19:
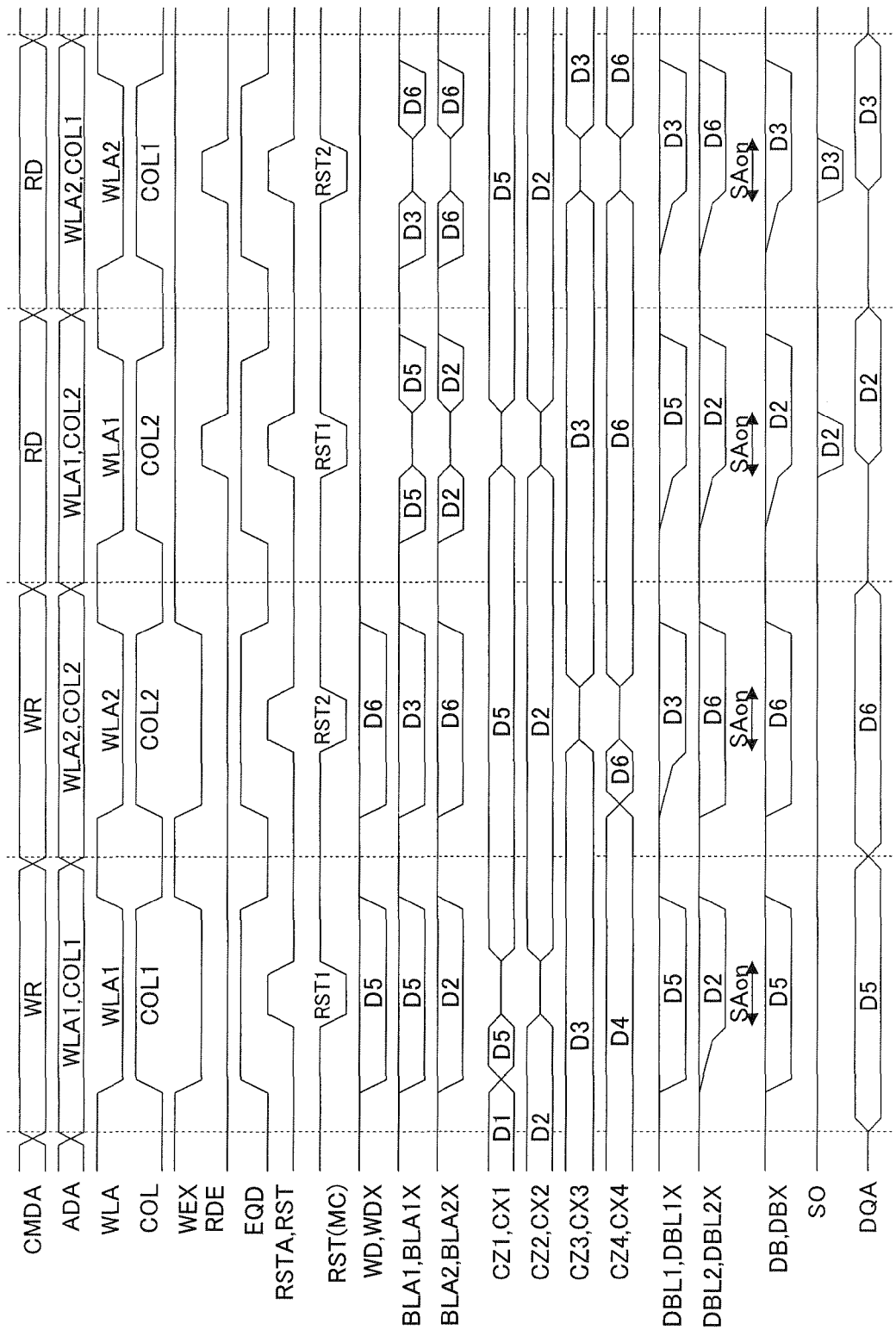
FIG. 19 illustrates an example of access operations of a semiconductor memory having the memory cell illustrated in FIG. 18.

FIG. 19 illustrates an example of access operations of a semiconductor memory MEM having the memory cell MC illustrated in FIG. 16. Detailed descriptions are not given as for the same operations as FIG. 9. Sequence of the write operation and the read operation, the memory cell MC to be accessed, and the data to be read/written are the same as FIG. 8 and FIG. 9. FIG. 19 is the same as FIG. 9 except that the word line signal WLA and the reset signals RST1-2 supplied to the memory cell MC are negative logic (low level pulse). The similar effect as the above-stated embodiment can also be obtained in this embodiment.

Figure 20:
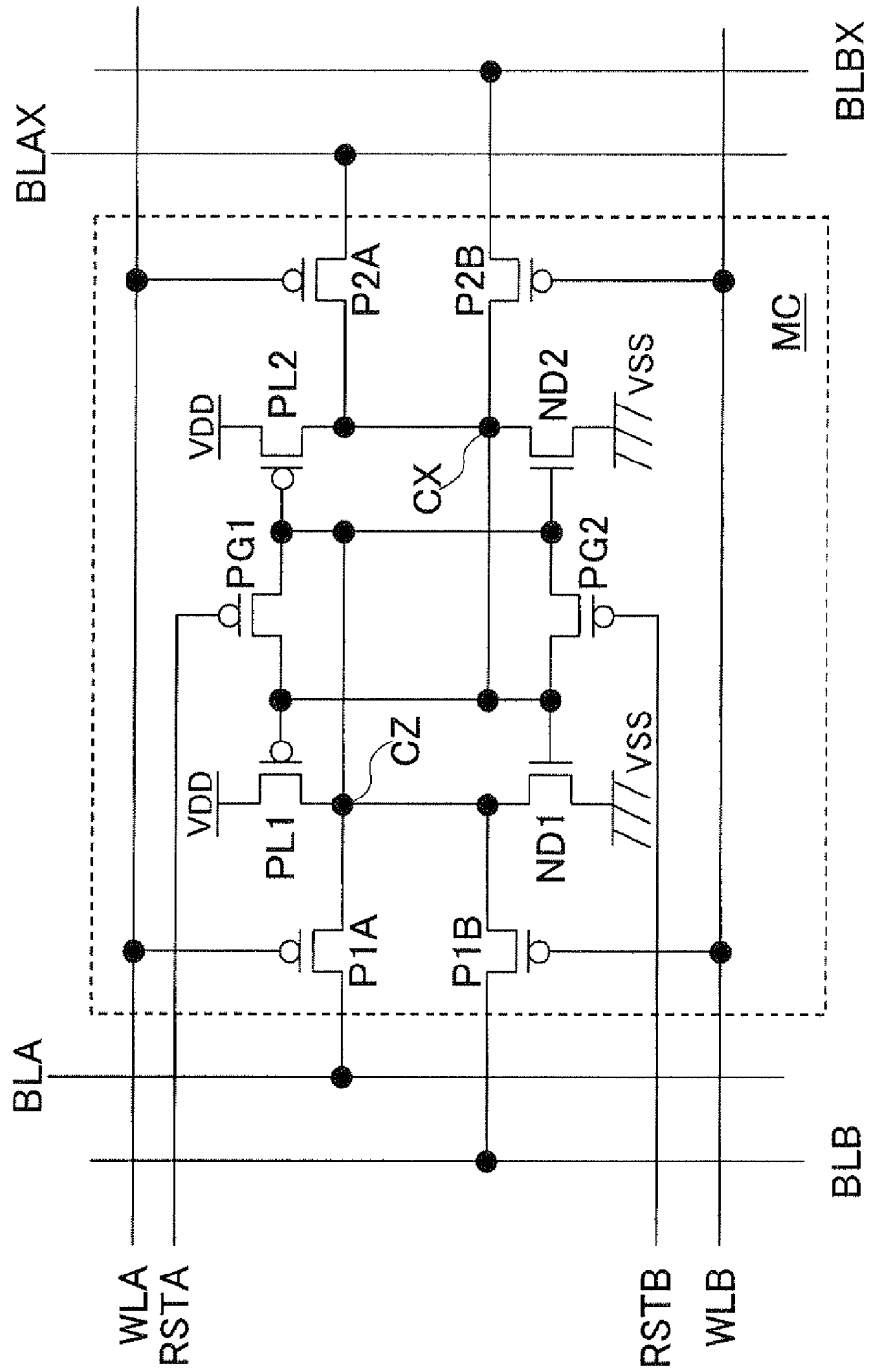
FIG. 20 illustrates an example of a memory cell in still another embodiment.

FIG. 20 illustrates an example of a memory cell MC in still another embodiment. The same reference symbols are added to designate the same and corresponding elements described in the above-stated embodiments, and the detailed description thereof will not be given. The memory cell MC is disposed in the memory cell array ARY illustrated in FIG. 1. The semiconductor memory MEM is the same as FIG. 1 except that the memory cell MC is different, and the reset signals RSTA, RSTB are directly supplied to the row decoders RDEC (A)/(B) without passing through the OR circuit. Namely, the semiconductor memory MEM is a static RAM in multiport type. The semiconductor memory MEM may operate in synchronous with the clock signal, or in asynchronous with the clock signal. The semiconductor memory MEM may be designed as a memory macro (IP) mounted on a system LSI and so on, or as a semiconductor storage device sealed in a package.

In this embodiment, the transfer transistors P1A, P2A, P1B, P2B and the short transistors PG1, PG2 are the pMOS transistors as same as FIG. 16. The other constitution of the memory cell MC is the same as FIG. 10. Namely, a gate of the short transistor PG1 receives the reset signal RSTA, and a gate of the short transistor PG2 receives the reset signal RSTB.

Figure 21:
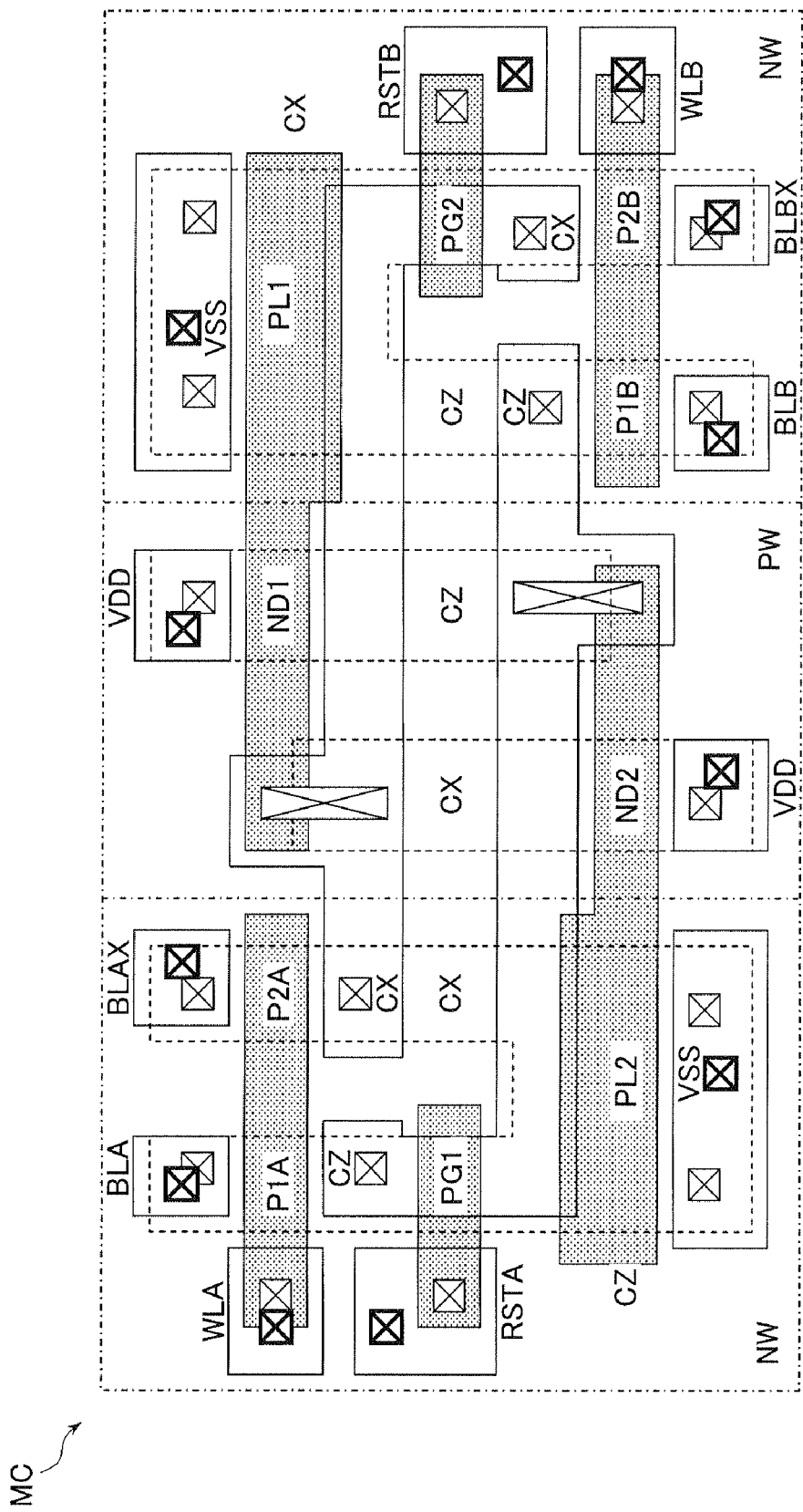
FIG. 21 illustrates an example of a layout of the memory cell illustrated in FIG. 20.

FIG. 21 illustrates an example of a layout of the memory cell illustrated in FIG. 20. Detailed descriptions are not given as for the same elements as FIG. 3. A difference from FIG. 3 is that the positions of the contacts C2 of the reset signals lines RSTA, RSTB are shifted to wire two reset signals RSTA, RSTB between the word lines WLA, WLB. The similar effect as the above-stated embodiment can also be obtained in this embodiment.

Figure 22:
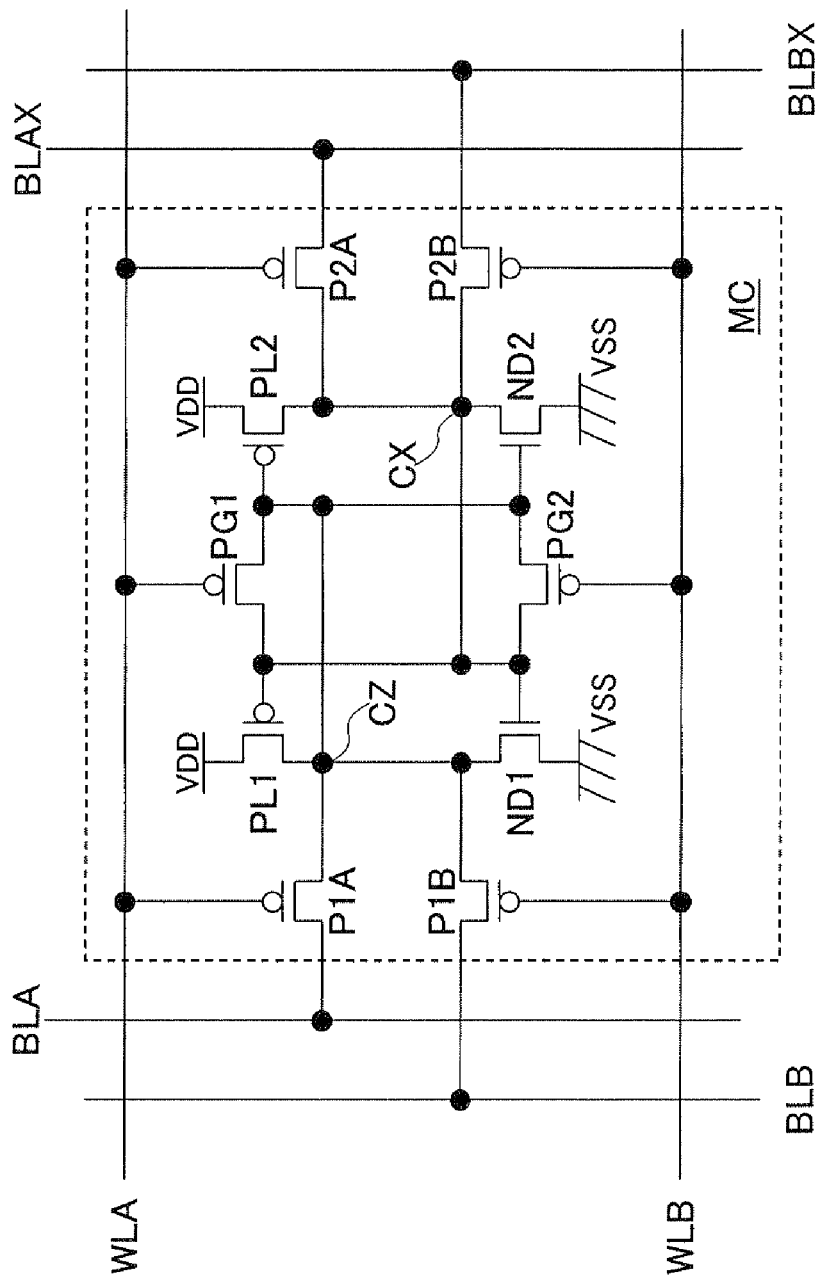
FIG. 22 illustrates an example of a memory cell in still another embodiment.

FIG. 22 illustrates an example of a memory cell MC in still another embodiment. The same reference symbols are added to designate the same and corresponding elements described in the above-stated embodiments, and the detailed description thereof will not be given. The memory cell MC is disposed in the memory cell array ARY illustrated in FIG. 1. The semiconductor memory MEM is the same as FIG. 1 except that the core control circuits 14A, 14B do not generate the reset signals RSTA, RSTB, and the OR circuit is not formed. Namely, the semiconductor memory MEM is a static RAM in multi-part type. The semiconductor memory MEM may operate in synchronous with the clock signal, or in asynchronous with the clock signal. The semiconductor memory MEM may be designed as a memory macro (IP) mounted on a system LSI and so on, or as a semiconductor storage device sealed in a package.

In this embodiment, the gates of the short transistors NG1, NG2 are respectively coupled to the word lines WLA, WLB as same as FIG. 12. Accordingly, the memory cell MC does not receive the reset signal RST. Besides, the transfer transistors P1A, P2A, P1B, P2B, and the short transistors PG1, PG2 are the pMOS transistors as same as FIG. 16.

The threshold voltages (absolute value) of the short transistors PG1, PG2 are manufactured to be higher than the threshold voltages (absolute value) of the transfer transistors P1A, P2A, P1B, P2B. Accordingly, the on period ON1 of the short transistors PG1, PG2 is included in the on period ON2 of the transfer transistors P1A, P2A, P1B, P2B as same as FIG. 14. The other constitution of the memory cell MC is the same as FIG. 16.

Figure 23:
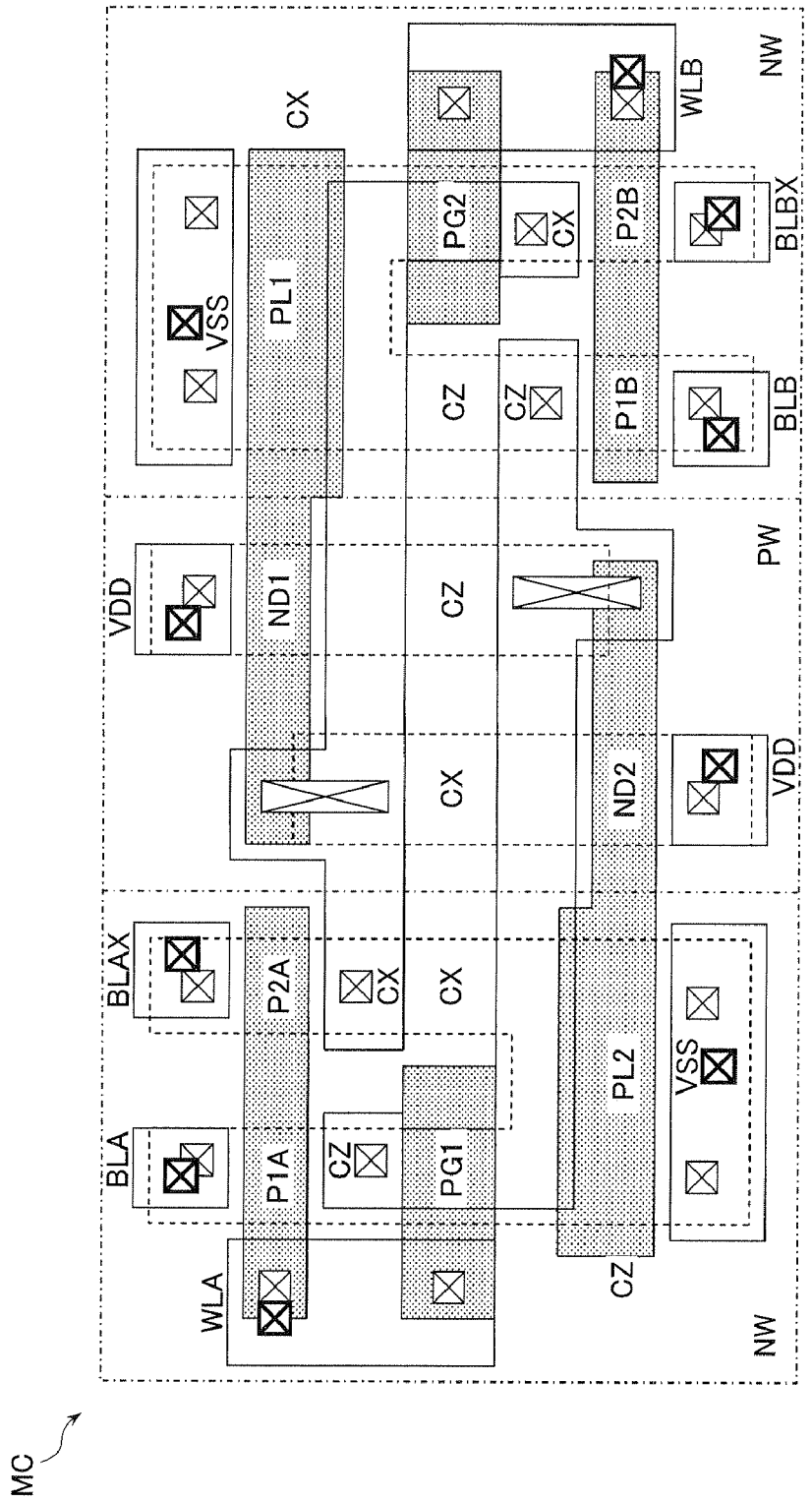
FIG. 23 illustrates an example of a layout of the memory cell illustrated in FIG. 22.

FIG. 23 illustrates an example of a layout of the memory cell illustrated in FIG. 22. The layout of the memory cell MC is the same as FIG. 17 except that the gates of the short transistors PG1, PG2 are respectively coupled to the word lines WLA, WLB.

Figure 24:
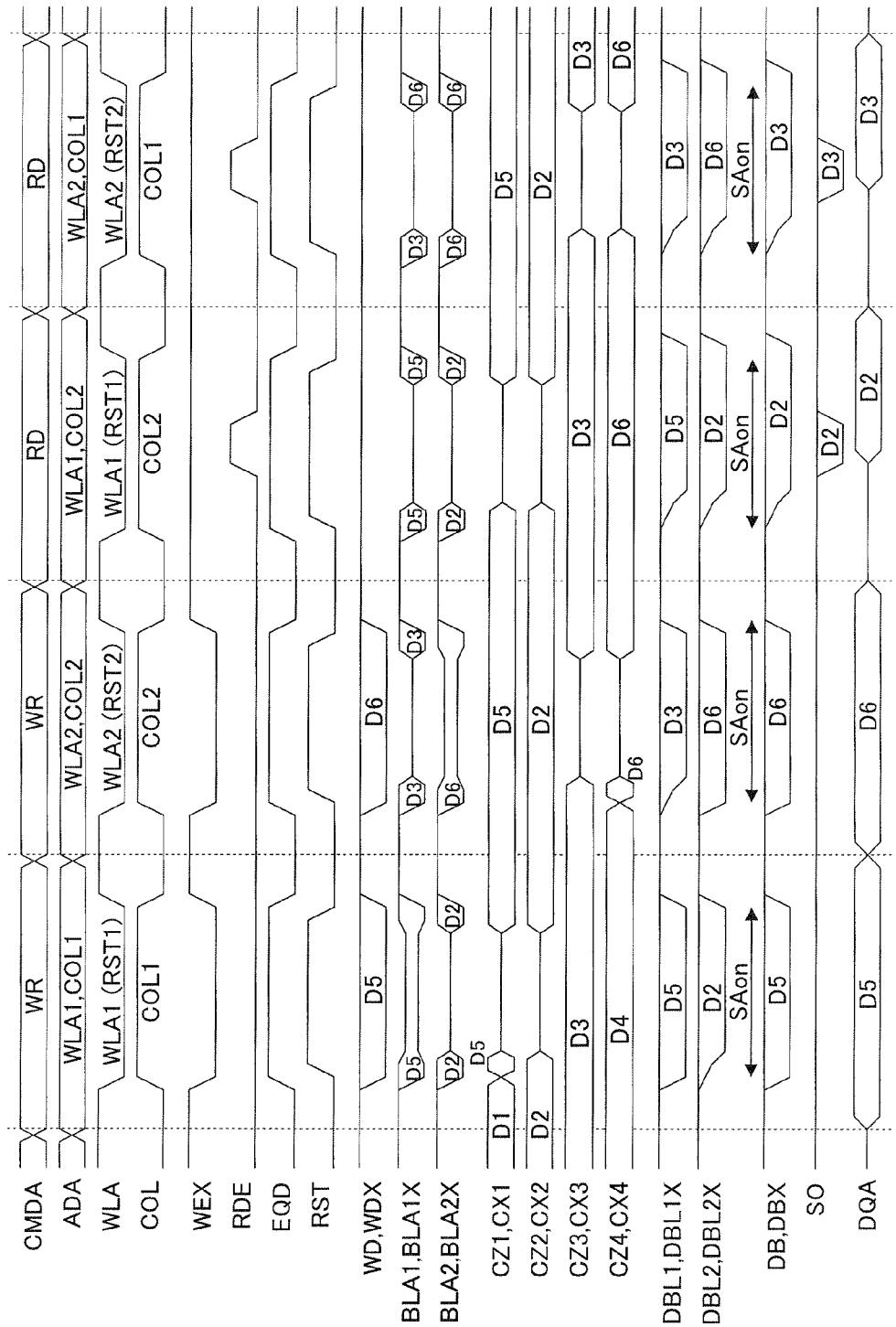
FIG. 24 illustrates an example of access operations of a semiconductor memory having the memory cell illustrated in FIG. 22.

FIG. 24 illustrates an example of access operations of a semiconductor memory MEM having the memory cell MC illustrated in FIG. 22. Detailed descriptions are not given as for the same operations as FIG. 15. Sequence of the write operation and the read operation, the memory cell MC to be accessed, and the data to be read/written are the same as FIG. 8 and FIG. 9. FIG. 24 is the same as FIG. 15 except that the word line signal WLA is negative logic (low level pulse). The similar effect as the above-stated embodiment can also be obtained in this embodiment.

Figure 25:
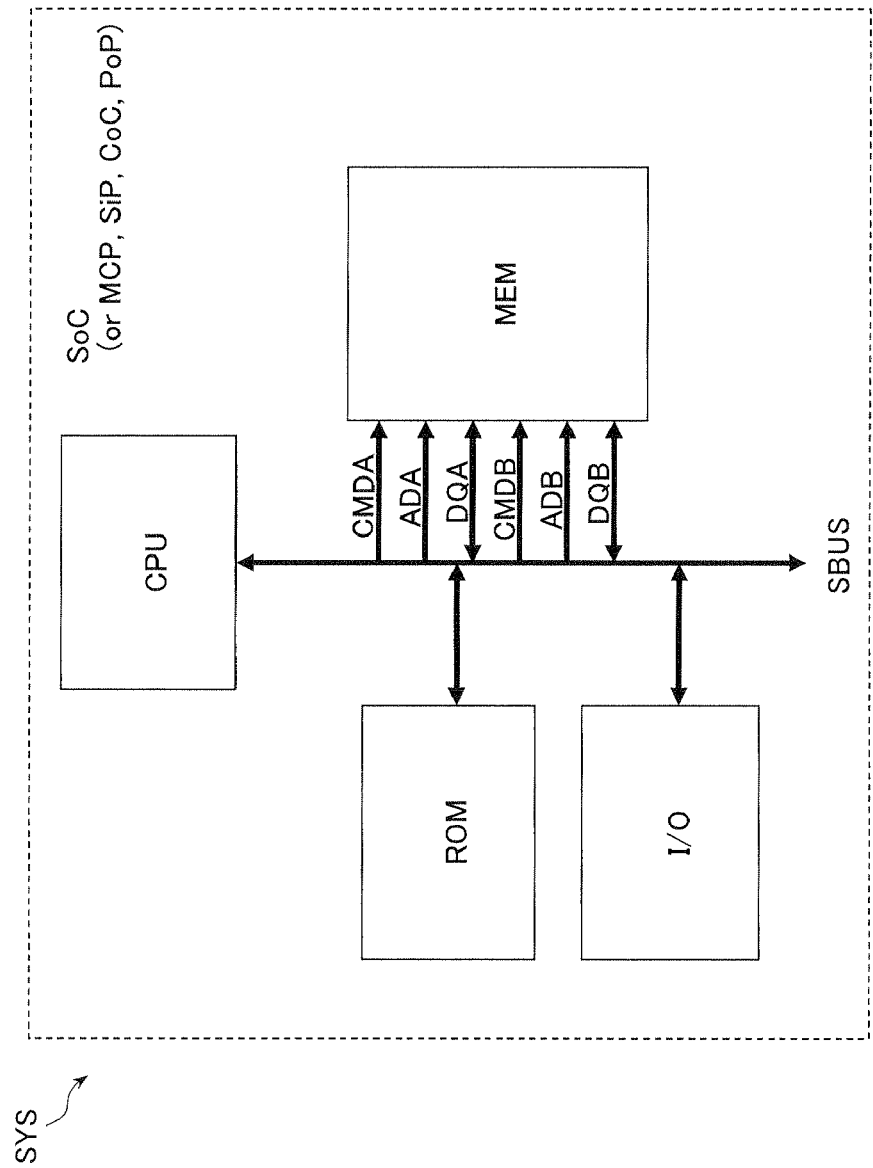
FIG. 25 illustrates an example of a system to which the semiconductor memory according to the above-stated embodiments is mounted.

FIG. 25 illustrates an example of a system SYS to which the semiconductor memory MEM of the above-stated embodiment is mounted. The system SYS (user system) includes, for example, at least a part of a micro computer system such as a portable equipment. The system SYS has a system-on-chip SoC in which plural macros are integrated on a silicon substrate. Otherwise, the system SYS has a multi-chip-package MCP in which plural chips are laminated on a package substrate. Otherwise, the system SYS has a system-in-package SiP in which plural chips are mounted on a package substrate such as a lead frame. Further, the system SYS may have in a mode of a chip-on-chip CoC or a package-on-package PoP.

For example, the SoC has a CPU (controller), a ROM, peripheral circuits I/O, and the above-stated semiconductor memory MEM. The CPU, the ROM, the peripheral circuits I/O, and the semiconductor memory MEM are coupled with each other by a system bus SBUS. Incidentally, a memory controller may be disposed between the CPU and the semiconductor memory MEM.

The CPU accesses the ROM, the peripheral circuits I/O and the semiconductor memory MEM, and controls all of the operations in the system. The semiconductor memory MEM executes the read operation and the write operation in accordance with an access request from the CPU. Incidentally, a minimum constitution of the system SYS is the CPU and the semiconductor memory MEM.

Incidentally, in the above-stated embodiments, it is described about the semiconductor memory having the static memory cell in multipart type. However, the above-stated embodiments may be applied to the semiconductor memory having the static memory cell in single port type as illustrated in the circuits in FIG. 8, in the operation waveforms in FIG. 9, and so on.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory, comprising
a memory cell including:
a first and a second inverters each including a load transistor and a driver transistor;
a latch circuit formed by coupling inputs and outputs of the first and the second inverters with each other, and having a first storage node coupled to the output of the first inverter and a second storage node coupled to the output of the second inverter;
a first and a second transfer transistors coupling the first and the second storage nodes to a first bit line pair, respectively;
a third and a fourth transfer transistors coupling the first and the second storage nodes to a second bit line pair, respectively; and
a first and a second short transistors coupling the first and the second storage nodes with each other, wherein:
the first transfer transistor, the first short transistor, and the driver transistor of the second inverter are disposed along one direction;
the fourth transfer transistor, the second short transistor, and the driver transistor of the first inverter are disposed along one direction;
the first transfer transistor and the first short transistor have a diffusion layer in common coupled to the first storage node;
the first short transistor and the driver transistor of the second inverter have a diffusion layer in common coupled to the second storage node;
the fourth transfer transistor and the second short transistor have a diffusion layer in common coupled to the second storage node; and
the second short transistor and the driver transistor of the first inverter have a diffusion layer in common coupled to the first storage node.

2. The semiconductor memory according to claim 1, wherein:
the first and the second transfer transistors are disposed so to have sources, gates, and drains thereof face with each other;
the third and the fourth transfer transistors are disposed so to have sources, gates, and drains thereof face with each other;
the diffusion layer of the first transfer transistor coupled to the first storage node faces a diffusion layer of the second transfer transistor coupled to the second storage node; and
the diffusion layer of the fourth transfer transistor coupled to the second storage node faces a diffusion layer of the third transfer transistor coupled to the first storage node.

3. The semiconductor memory according to claim 1, wherein
the first and the second short transistors have gates coupled to a common reset signal line.

4. The semiconductor memory according to claim 1, wherein
the first and the second short transistors have gates coupled to reset signal lines different from one another.

5. The semiconductor memory according to claim 1, wherein:
the first short transistor has a gate coupled to a first word line together with gates of the first and the second transfer transistors; and
the second short transistor has a gate coupled to a second word line together with gates of the third and the fourth transfer transistors.

6. A semiconductor memory, comprising:
at least one of memory cells each including a latch circuit having complementary storage nodes, a first short transistor turned on during an activation of a first reset signal and coupling the complementary storage nodes with each other, and a first transfer transistor pair;
a first bit line pair respectively coupled to the complementary storage nodes via the first transfer transistor pair;
a first switch circuit turned on during an inactivation of the first reset signal;
a first sense amplifier coupled to the first bit line pair via the first switch circuit and performing an amplifying operation during the activation of the first reset signal; and
a core control circuit generating the first reset signal of which a period of the activation is included in an on period of the first transfer transistor pair in a write operation.

7. The semiconductor memory according to claim 6, comprising:
a first word line coupled to the first transfer transistor pair of a certain number of the memory cells;
write switches coupling the first bit line pair to write data lines, the first bit line pair being coupled to each of the memory cells; and
a write control circuit turning on a certain number of the write switches to write data to a part of the memory cells among the memory cells coupled to the first word line in the write operation.

8. The semiconductor memory according to claim 6, wherein
the core control circuit generates the first reset signal in a read operation.

9. The semiconductor memory according to claim 6, comprising
a first word line coupled to the first transfer transistor pair of each of the memory cells, wherein:
the first short transistor receives a word line signal supplied to the first word line as the first reset signal; and
a threshold voltage of the first short transistor is higher than respective threshold voltages of the first transfer transistor pair.

10. The semiconductor memory according to claim 6, comprising:
a second transfer transistor pair provided at each of the memory cells;
a second bit line pair respectively coupled to the complementary storage nodes via the second transfer transistor pair;
a second switch circuit turned on during the inactivation of the first reset signal; and
a second sense amplifier coupled to the second bit line pair via the second switch circuit and performing an amplifying operation during the activation of the first reset signal, wherein
the core control circuit generates the first reset signal of which the period of the activation is included in the on period of the first transfer transistor pair and an on period of second transfer transistor pair.

11. A system comprising a semiconductor memory, wherein
the semiconductor memory comprising
a memory cell including:
a first and a second inverters each including a load transistor and a driver transistor;
a latch circuit formed by coupling inputs and outputs of the first and the second inverters with each other, and having a first storage node coupled to the output of the first inverter and a second storage node coupled to the output of the second inverter;
a first and a second transfer transistors coupling the first and the second storage nodes to a first bit line pair, respectively;
a third and a fourth transfer transistors coupling the first and the second storage nodes to a second bit line pair, respectively; and
a first and a second short transistors coupling the first and the second storage nodes with each other, wherein:
the first transfer transistor, the first short transistor, and the driver transistor of the second inverter are disposed along one direction;
the fourth transfer transistor, the second short transistor, and the driver transistor of the first inverter are disposed along one direction;
the first transfer transistor and the first short transistor have a diffusion layer in common coupled to the first storage node;
the first short transistor and the driver transistor of the second inverter have a diffusion layer in common coupled to the second storage node;
the fourth transfer transistor and the second short transistor have a diffusion layer in common coupled to the second storage node; and
the second short transistor and the driver transistor of the first inverter have a diffusion layer in common coupled to the first storage node.

12. A system comprising a semiconductor memory, wherein
the semiconductor memory comprising
at least one of memory cells each including a latch circuit having complementary storage nodes, a first short transistor which turned on during an activation of a first reset signal and coupling the complementary storage nodes with each other, and a first transfer transistor pair;
a first bit line pair respectively coupled to the complementary storage nodes via the first transfer transistor pair;
a first switch circuit which turned on during an inactivation of the first reset signal;
a first sense amplifier coupled to the first bit line pair via the first switch circuit and performing an amplifying operation during the activation of the first reset signal; and
a core control circuit generating the first reset signal of which a period of the activation is included in an on period of the first transfer transistor pair in a write operation.

* * * * *